(12) United States Patent
Matsuda et al.

(10) Patent No.: US 8,383,427 B2
(45) Date of Patent: Feb. 26, 2013

(54) SEMICONDUCTOR DEVICE INCLUDING A MAGNETIC TUNNEL JUNCTION DEVICE INCLUDING A LAMINATED STRUCTURE AND MANUFACTURING METHOD THEREFOR

(75) Inventors: Ryoji Matsuda, Tokyo (JP); Shuichi Ueno, Tokyo (JP); Haruo Furuta, Tokyo (JP); Takashi Takenaga, Tokyo (JP); Takeharu Kuroiwa, Tokyo (JP)

(73) Assignee: Renesas Electronics Corporation, Kawasaki-Shi (JP)

( * ) Notice: Subject to any disclaimer, the term of this patent is extended or adjusted under 35 U.S.C. 154(b) by 0 days.

(21) Appl. No.: 13/566,739

(22) Filed: Aug. 3, 2012

(65) Prior Publication Data

US 2012/0301975 A1 Nov. 29, 2012

Related U.S. Application Data

(62) Division of application No. 12/463,865, filed on May 11, 2009, now Pat. No. 8,258,592.

(30) Foreign Application Priority Data

Jun. 4, 2008 (JP) ................................. 2008-146961

(51) Int. Cl.
*H01L 29/82* (2006.01)
*G11C 11/02* (2006.01)

(52) U.S. Cl. ............ 438/3; 257/421; 257/427; 365/157; 365/158; 365/171; 365/173; 360/324.2; 360/326

(58) Field of Classification Search .......... 257/421–427, 257/E29.323; 421/3; 365/157–158, 171–173; 360/324–326, 313; 29/737
See application file for complete search history.

(56) References Cited

U.S. PATENT DOCUMENTS

| 7,105,372 B2 | 9/2006 | Min et al. |
| 7,449,345 B2 | 11/2008 | Horng et al. |

| 2003/0235016 A1 | 12/2003 | Gill |
| 2006/0176735 A1 | 8/2006 | Yuasa |
| 2006/0180839 A1 | 8/2006 | Fukumoto et al. |

(Continued)

FOREIGN PATENT DOCUMENTS

| JP | 2005-085821 | 3/2005 |
| JP | 2005-210126 | 8/2005 |

(Continued)

OTHER PUBLICATIONS

Cheng-Tyng Yen et al., "Improvement of Switching Field in Magnetic Tunneling Junction Using Ru/Ta Capping Layer," IEEE Transactions on Magnetics, vol. 42, No. 10, 2006, pp. 2748-2750.

Rong-Tan Huang, et al. "Diffusion behavior in spin valves studied by high resolution transmission electron microscopy and nanobeam technique" Journal of Magnetism and Magnetic Materials, 2003, vol. 260, p. 28-36.

(Continued)

*Primary Examiner* — Jami M Valentine
(74) *Attorney, Agent, or Firm* — McDermott Will & Emery LLP

(57) ABSTRACT

A semiconductor device having a MTJ device excellent in operating characteristics and a manufacturing method therefor are provided. The MTJ device is formed of a laminated structure which is obtained by laminating a lower magnetic film, a tunnel insulating film, and an upper magnetic film in this order. The lower and upper magnetic films contain non-crystalline or microcrystalline ferrocobalt boron (CoFeB) as a constituent material. The tunnel insulating film contains aluminum oxide ($AlO_x$) as a constituent material. A CAP layer is formed over the upper magnetic film and a hard mask is formed over the CAP layer. The CAP layer contains a substance of crystalline ruthenium (Ru) as a constituent material and the hard mask contains a substance of crystalline tantalum (Ta) as a constituent material. The film thickness of the hard mask is larger than that of the CAP layer.

5 Claims, 28 Drawing Sheets

U.S. PATENT DOCUMENTS

| | | |
|---|---|---|
| 2006/0220084 A1 | 10/2006 | Umehara et al. |
| 2007/0014149 A1 | 1/2007 | Nagamine et al. |
| 2007/0108543 A1 | 5/2007 | Furuta et al. |
| 2008/0075979 A1 | 3/2008 | Inamura et al. |
| 2008/0278865 A1 | 11/2008 | Tsunekawa et al. |

FOREIGN PATENT DOCUMENTS

| | | |
|---|---|---|
| JP | 2006-005356 | 1/2006 |
| JP | 2006-210391 A | 8/2006 |
| JP | 2006-261592 A | 9/2006 |
| JP | 2006-261637 A | 9/2006 |
| JP | 2007-005555 | 1/2007 |
| JP | 2007-158301 | 6/2007 |

OTHER PUBLICATIONS

Rong-Tan Huang, et al. "Diffusion behavior of the spin valve structure" Journal of Applied Physics, Jun. 1, 2001, vol. 89, No. 11, p. 7625-7627.

Dexin Wang, et al. "70% TMR at Room Temperature for SDT Sandwich Junctions With CoFeB as Free and Reference Layers" IEEE Transactions on Magnetics, Jul. 2004, vol. 40, No. 4, p. 2269-2271.

Notification of Reasons for Refusal, and English translation thereof, issued in Japanese Patent Application No. 2008-146961 dated Oct. 16, 2012.

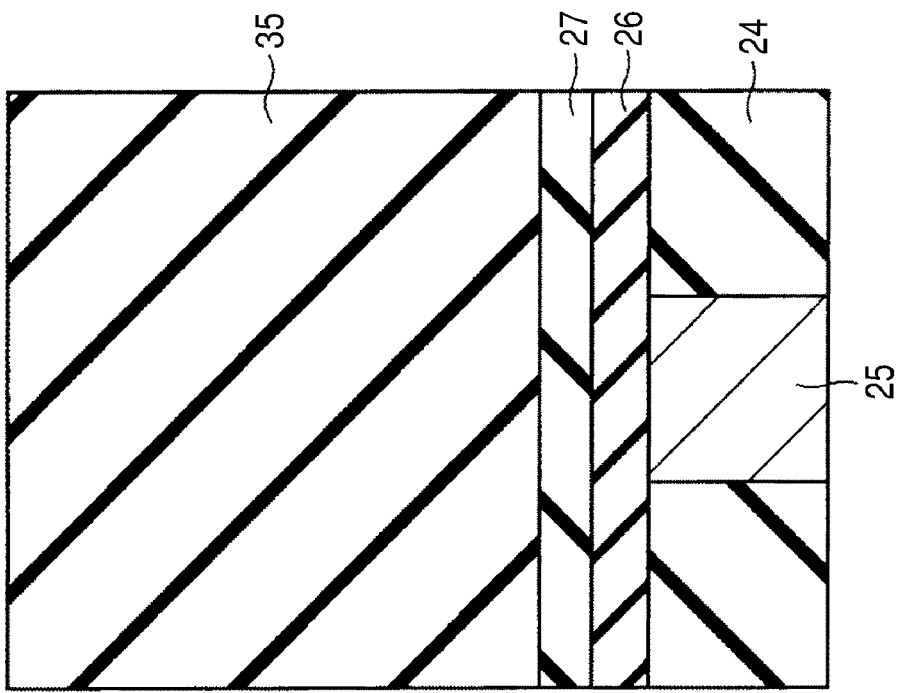
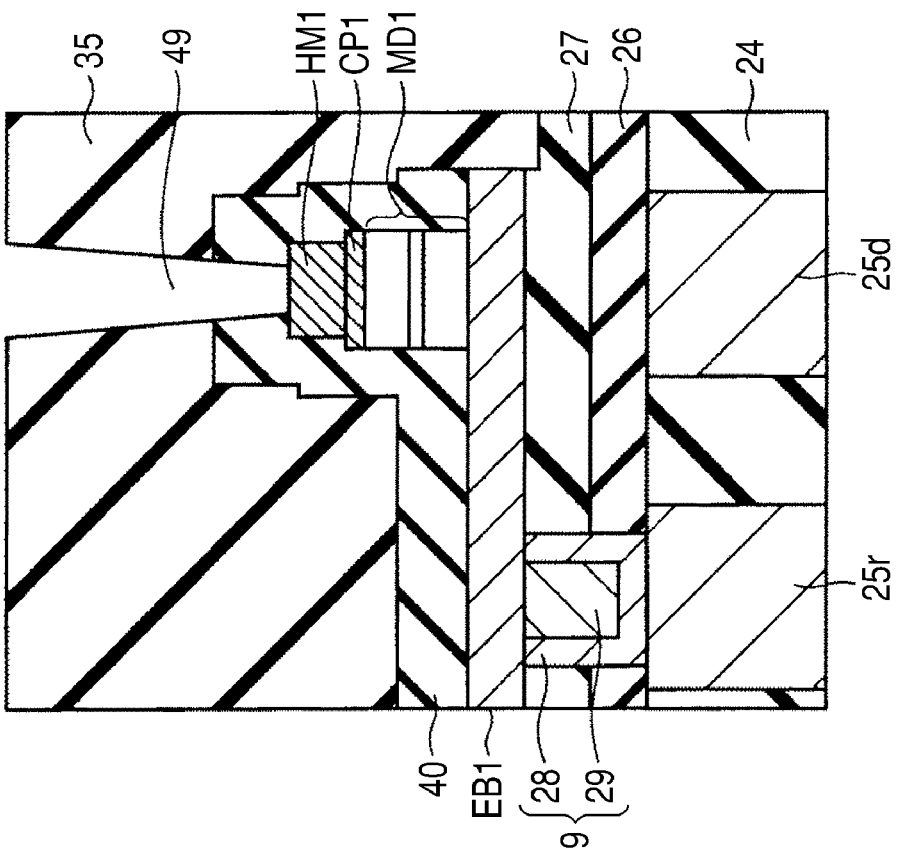

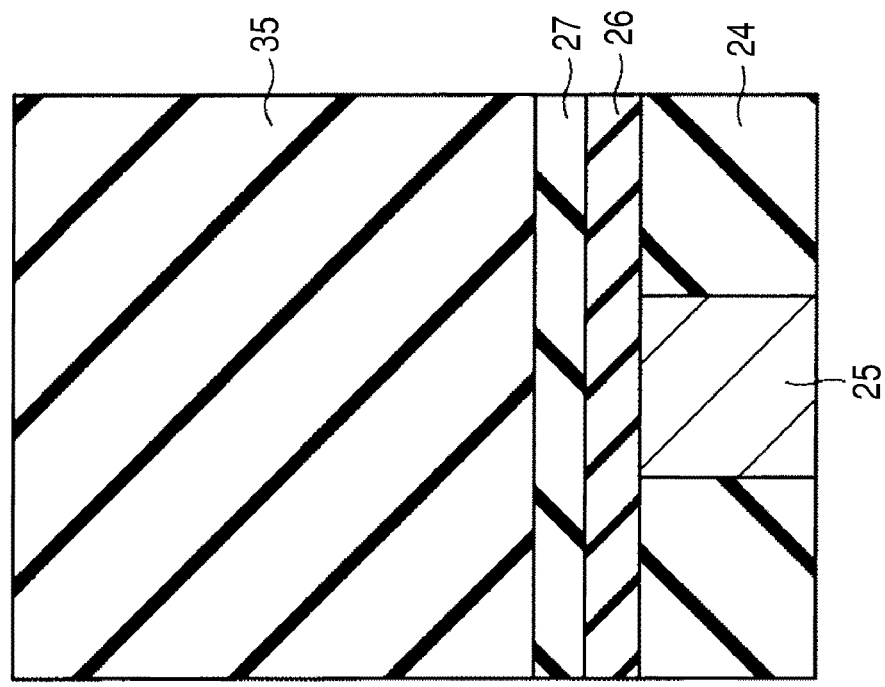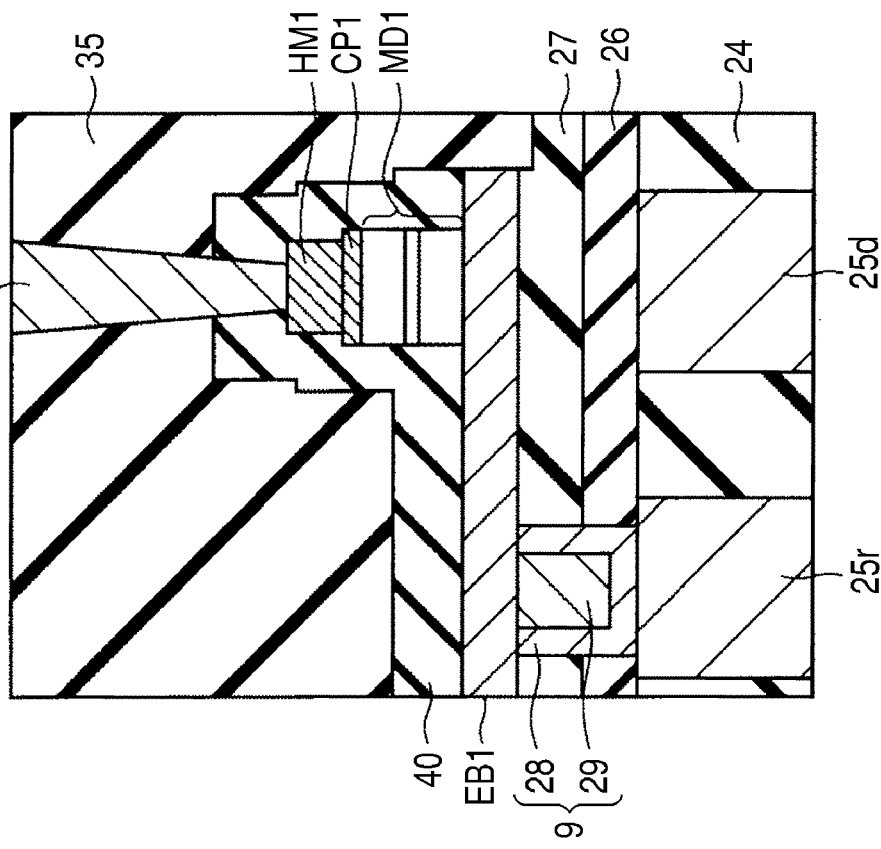

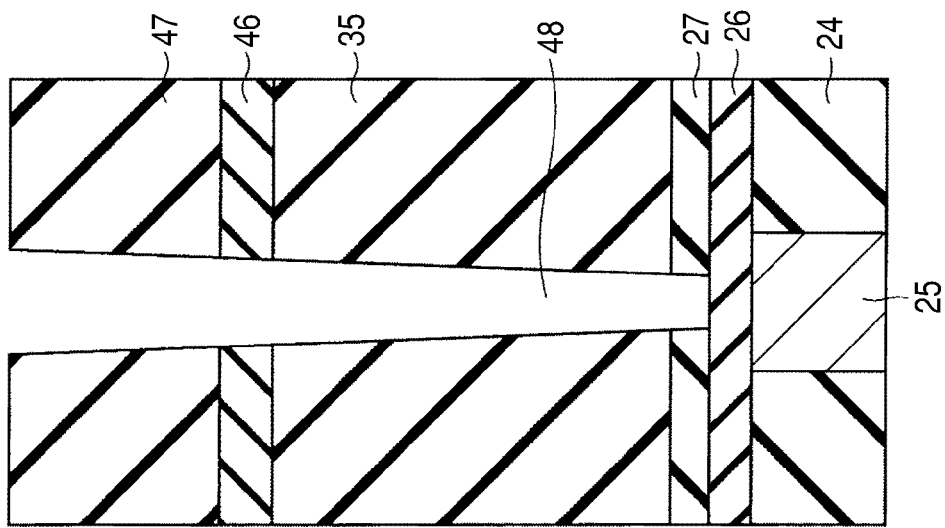
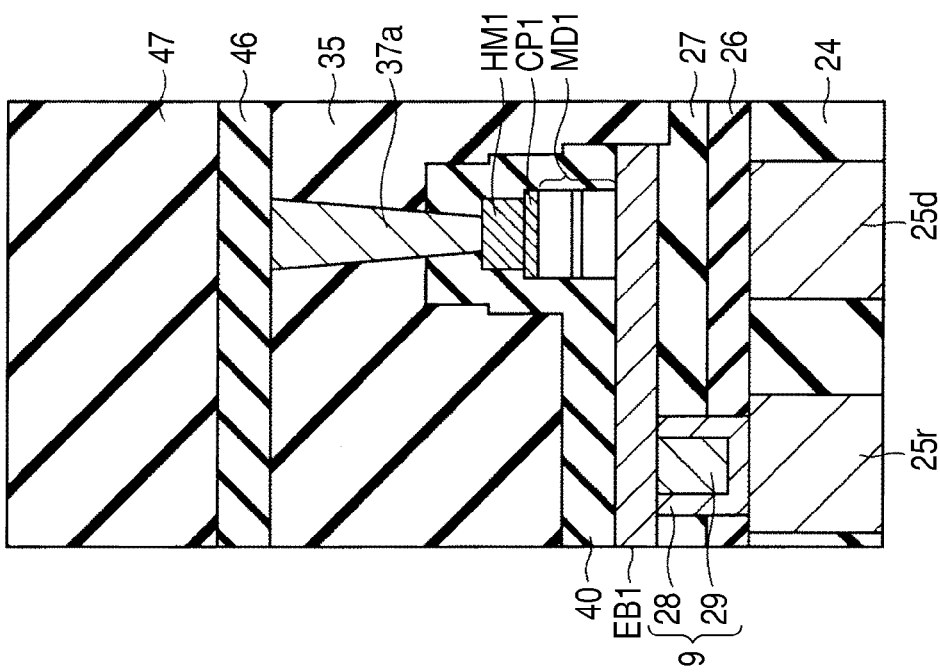

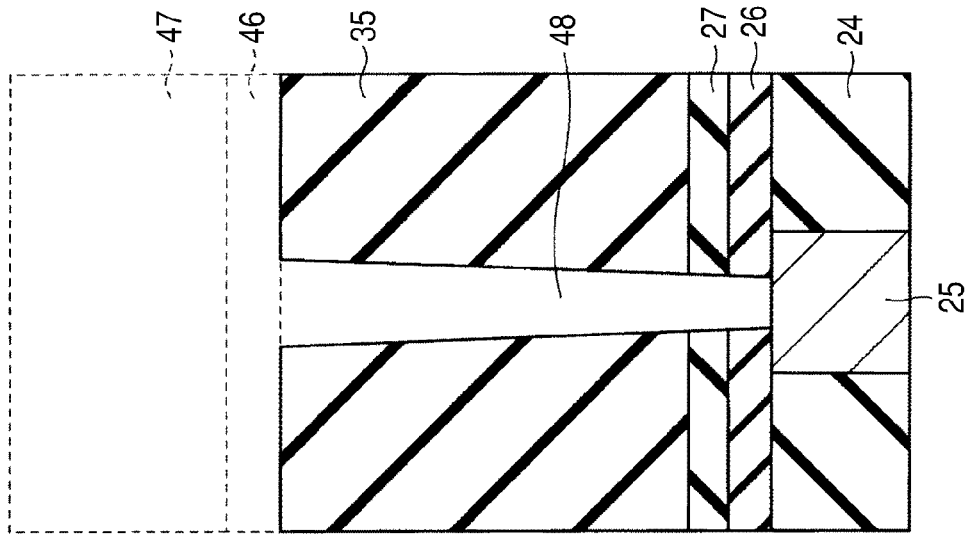
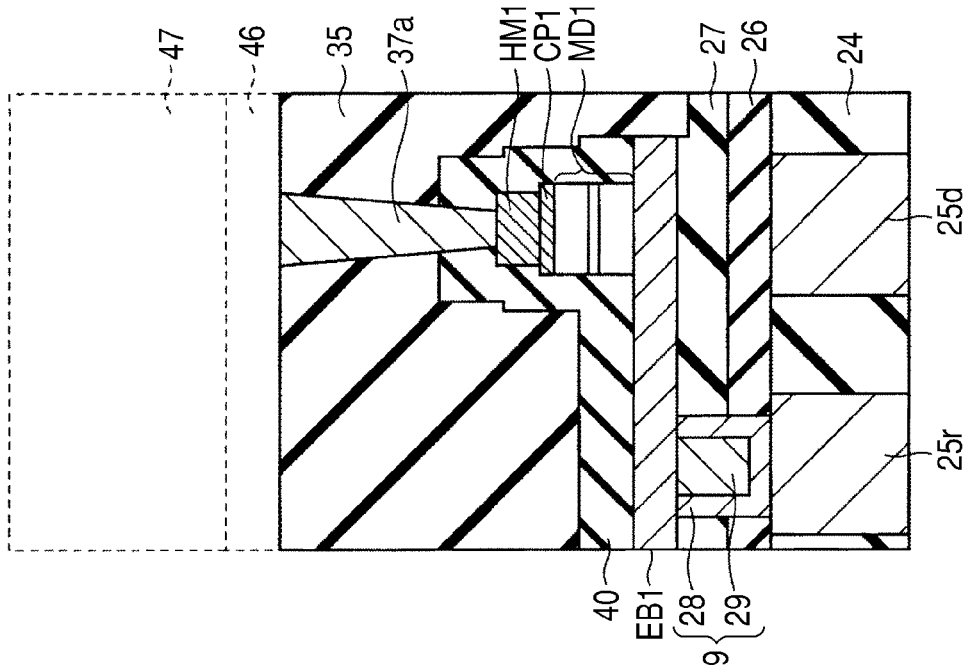

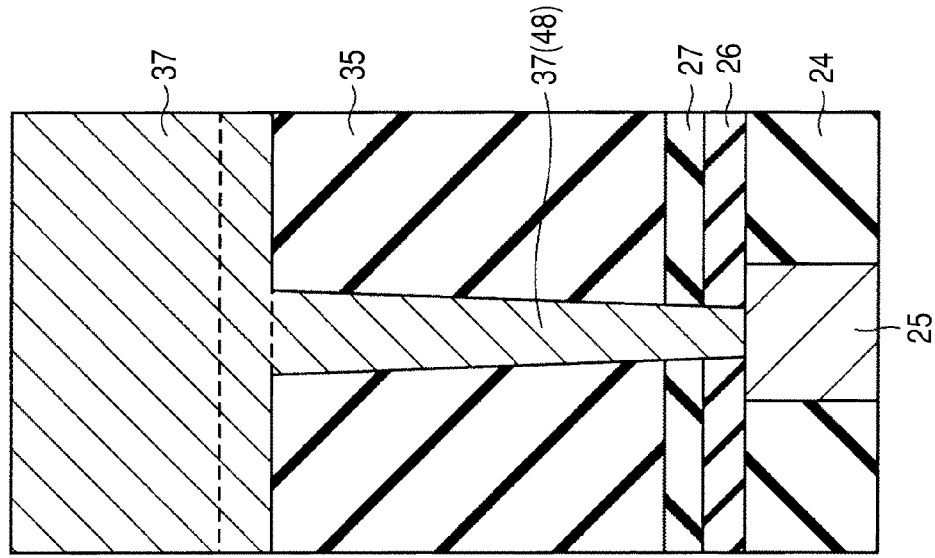
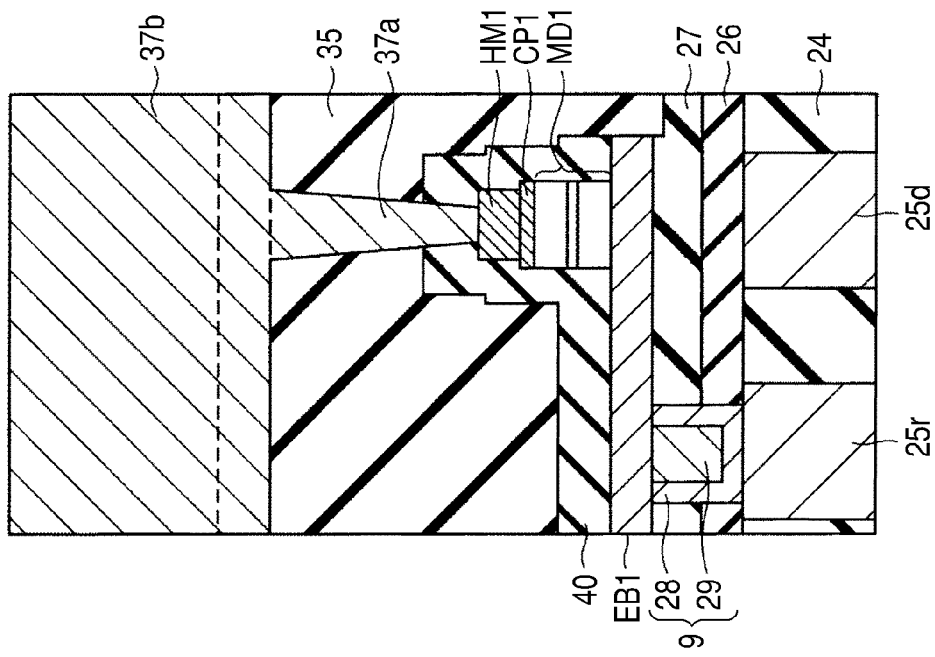

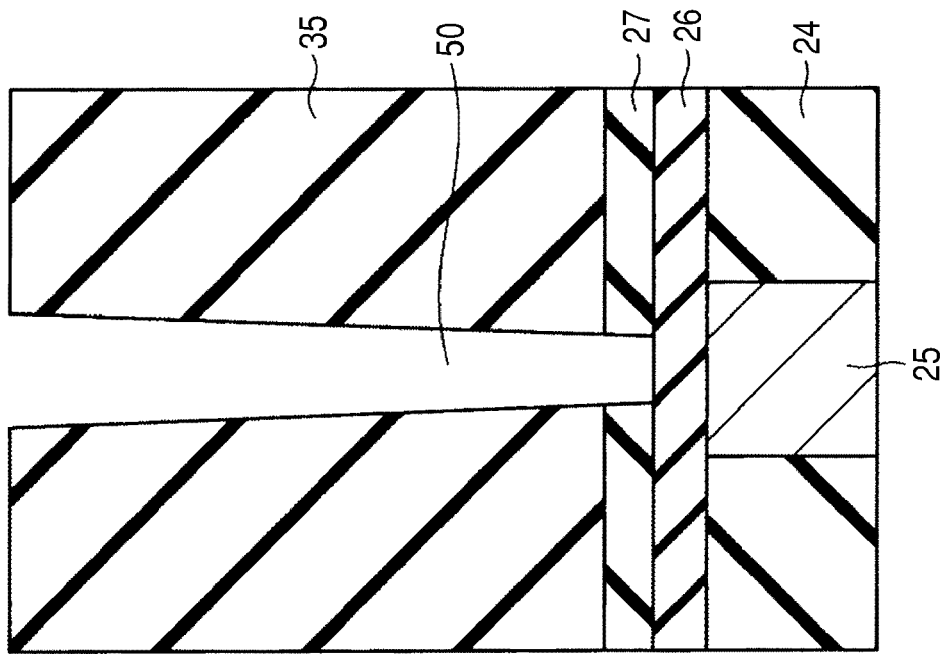
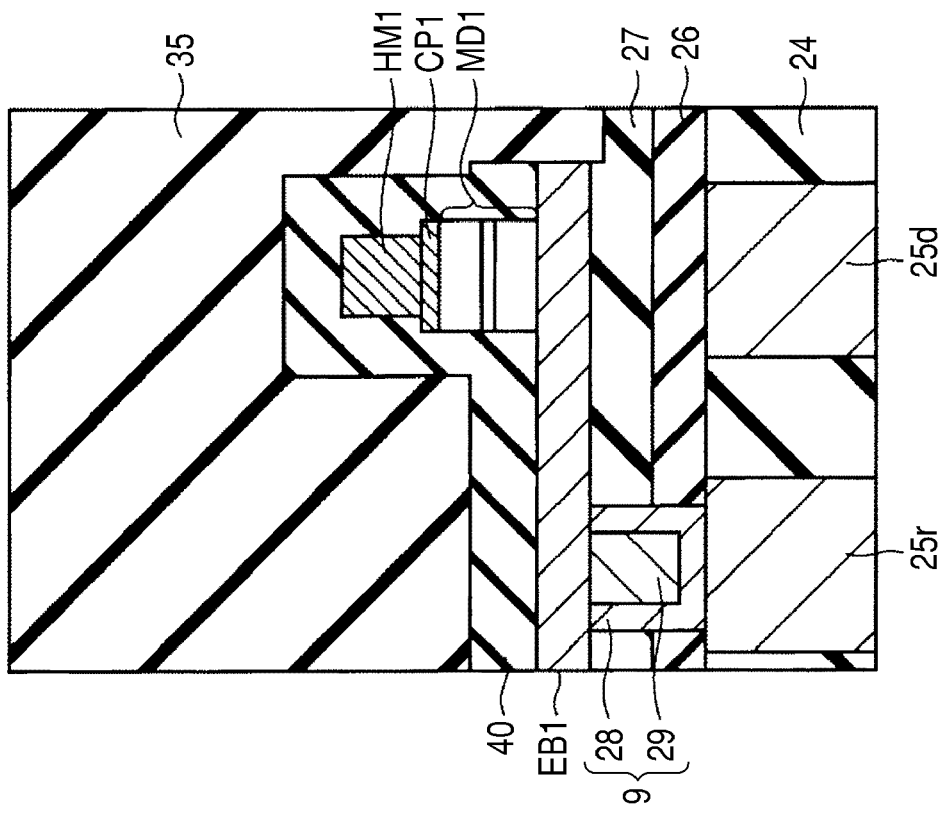

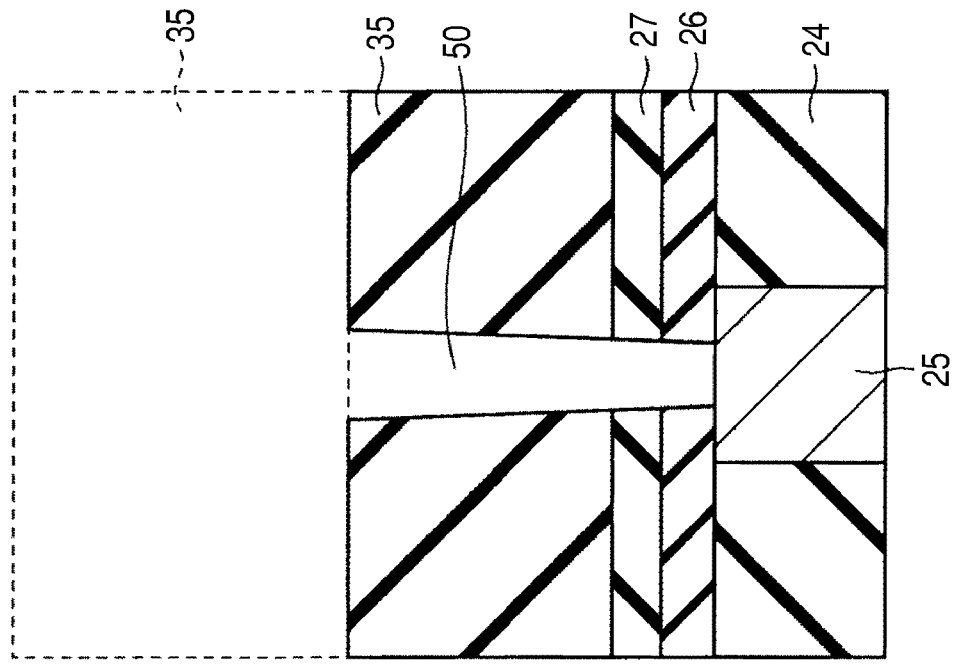
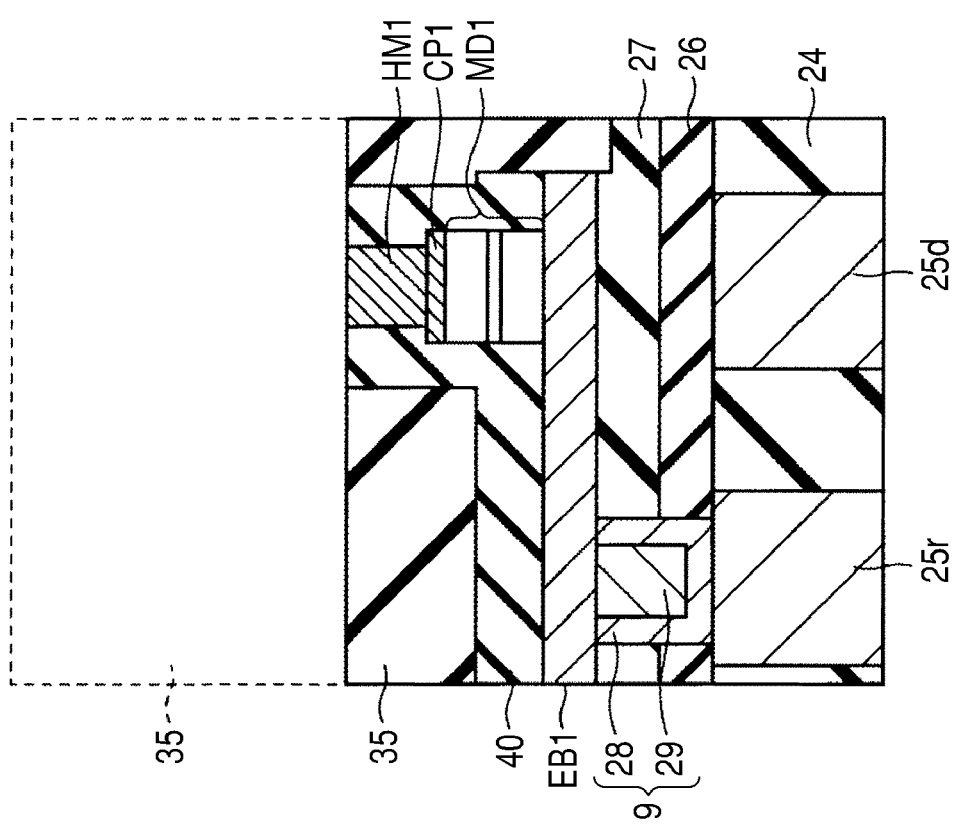

US 8,383,427 B2

SEMICONDUCTOR DEVICE INCLUDING A MAGNETIC TUNNEL JUNCTION DEVICE INCLUDING A LAMINATED STRUCTURE AND MANUFACTURING METHOD THEREFOR

CROSS-REFERENCE TO RELATED APPLICATIONS

This application is a Divisional of U.S. application Ser. No. 12/463,865, filed on May 11, 2009 now U.S. Pat. No. 8,258,592, claiming priority of Japanese Patent Application No. 2008-146961, filed on Jun. 4, 2008, the entire contents of each of which are hereby incorporated by reference.

BACKGROUND OF THE INVENTION

The present invention relates to a semiconductor device having a memory device such as an MTJ (Magnetic Tunnel Junction) device and a manufacturing method therefor.

MRAM is a memory that uses a magnetic material for memory devices and stores data by the orientation of magnetization in the magnetic material, that is, holds data by storing information in the spin of electrons. The circuit of the MRAM is randomly accessible. One of memory devices utilized as MRAM is MTJ device. In this specification, MTJ device is used as a concept including TMR (Tunneling Magneto Resistance) device.

FIG. 29 is a sectional view illustrating the general configuration of a memory device in a conventional MRAM. As illustrated in the drawing, an MTJ device MD9 is formed over a metal film strap EB9 that makes a lower electrode and an upper electrode ET9 is formed over the MTJ device MD9. The MTJ device MD9 is formed of a laminated structure obtained by laminating a lower magnetic film 96, a tunnel insulating film 97, and an upper magnetic film 98 in this order.

FIG. 30 is an explanatory drawing illustrating the outline of a conventional MRAM configuration. As illustrated in the drawing, multiple MTJ devices MD9 are arranged in a matrix pattern. (The metal film strap EB9 or the upper electrode ET9 is not shown in the drawing.) Multiple upper Cu wirings Y1 to Y5 are formed along the direction of columns (obliquely horizontal direction in the drawing) and are electrically coupled with MTJ devices MD9 on a column-by-column basis. Multiple lower Cu wirings X1 to X6 are formed along the direction of rows (obliquely vertical direction in the drawing) and are electrically coupled with MTJ devices MD9 on a row-by-row basis.

FIG. 31 is a sectional view illustrating the detailed relation of coupling between an MTJ device MD9 and an upper Cu wiring 37 and lower Cu wirings 25 (read line 25r, digit line (word line) 25d). As illustrated in the drawing, the lower Cu wirings 25 are selectively formed so that they penetrate an interlayer insulating film 23 formed over a semiconductor substrate (not shown). A silicon nitride film 86 and an interlayer insulating film 24 are laminated over the interlayer insulating film 23 including the lower Cu wirings 25. A via hole 109 (local via) is provided in the silicon nitride film 86 and the interlayer insulating film 24 corresponding to part of a formation region for the read line 25r as viewed on a plane. A metal film strap EB9 that makes an extraction wiring (LS (Local Strap)) is selectively formed over the interlayer insulating film 24 and in the bottom face of and over the side face of the via hole 109 and as a result, the metal film strap EB9 is electrically coupled with the read line 25r.

Over the metal film strap EB9, the MTJ device MD9 is selectively formed in a region corresponding to part of a formation region for the digit line 25d as viewed on a plane. An upper electrode ET9 is formed over the MTJ device MD9.

An interlayer insulating film 66 comprised of $SiO_2$ is formed so that it covers the entire surface including the MTJ device MD9 and the upper electrode ET9.

The upper Cu wiring 37 that makes a bit line is selectively formed over the interlayer insulating film 66. A via hole 49 is formed in part of the region where the MTJ device MD9 is formed as viewed on a plane so that the via hole penetrates the interlayer insulating film 66. The upper Cu wiring 37 is also filled in this via hole 49 and as a result, the upper Cu wiring 37 and the upper electrode ET9 are electrically coupled with each other.

As mentioned above, the metal film strap EB9 is formed in the via hole 109 and the lower Cu wirings 25 (read line 25r) and the MTJ device MD9 are thereby electrically coupled with each other. This common structure of coupling (hereafter, also simply referred to as "via LS coupling structure") is as illustrated in FIG. 31.

The same MRAM structure as the MRAM illustrated in FIG. 29 to FIG. 31 is disclosed in, for example, Patent Document 1.

To obtain the structure illustrated in FIG. 31, in general, a manufacturing process comprised of the following steps (1) to (9) is carried out. (1) The silicon nitride film 86 and the interlayer insulating film 24 are deposited over the interlayer insulating film 23 including the lower Cu wirings 25. (2) The via hole 109 penetrating the silicon nitride film 86 and the interlayer insulating film 24 is selectively formed. (3) A metal thin film that makes the metal film strap EB9 is deposited over the interlayer insulating film 24 including the via hole 109. (4) Respective formation layers for the MTJ device MD9 and the upper electrode ET9 are deposited over the metal film strap EB9 over the interlayer insulating film 24. (5) The above formation layers are patterned to obtain the MTJ device MD9 and the upper electrode ET9. (6) The metal thin film formed at the above step (3) is patterned to form the metal film strap EB9. (7) The interlayer insulating film 66 is deposited over the entire surface. (8) Formation regions for the via hole 49 penetrating the interlayer insulating film 66 and the upper Cu wiring 37 are selectively formed. (9) The upper Cu wiring 37 is deposited and filled and then CMP processing is carried out.

[Patent Document 1]
Japanese Unexamined Patent Publication No. 2005-85821

SUMMARY OF THE INVENTION

The drawings from FIG. 32 to FIG. 35 are sectional views illustrating the details of the above-mentioned step (5) of forming the MTJ device MD9 and the upper electrode ET9.

As illustrated in FIG. 32, the above-mentioned steps (1) to (4) are carried out to obtain the laminated structure of the following layers and film: a buried wiring metal layer 88 (equivalent to the metal thin film formed at the above step (3)); a film 89 for MTJ (equivalent to the formation layer for the MTJ device MD9 formed at the above step (4)); and a metal layer 90 (equivalent to the formation layer for the upper electrode ET9 formed at the above step (4)). An example of possible materials of the buried wiring metal layer 88 and the metal layer 90 is tantalum (Ta).

As illustrated in FIG. 32, selectively patterned resist 91 is formed over the metal layer 90 using photolithography. The MTJ memory cell patterns of the MTJ devices MD9 and the upper electrodes ET9 are defined by the patterned resist 91.

As illustrated in FIG. 33, subsequently, the metal layer 90 is processed using the patterned resist 91 as a mask to obtain the upper electrodes ET9. At this time, for example, etching damage is done to a region that becomes a free layer in the film 89 for MTJ in a damage region R1 or deposit (Ta) or etching reactant sticks to the surface of the film 89 for MTJ in a deposit-or-the-like adhesion region R2. FIG. 33 schematically depicts how a deposit-or-the-like deposition film 92 is formed over the film 89 for MTJ.

As illustrated in FIG. 34, the resist 91 is removed by ashing. During ashing, the following takes place with a deposit-or-the-like adhesion region R3 left: a region that makes a free layer in the film 89 for MTJ is oxidized in an oxide formation region R4; or the above region that makes the free layer is damaged in a free layer damage region R5. FIG. 34 schematically depicts how a during-etching oxide film 93 is formed in addition to the deposit-or-the-like deposition film 92.

The film 89 for MTJ is processed using the upper electrodes ET9 as a mask to obtain the MTJ devices MD9. At this time, for example, the following takes place: a region where deposit stuck when the metal layer 90 was processed or during asking is left in a damage-or-the-like remaining region R6; for example, damage-or-the-like remaining regions R7, R9 are damaged when the film 89 for MTJ is processed; and a region where the above free layer is oxidized is formed in a damage-or-the-like remaining region R8. FIG. 35 schematically depicts how the during-etching oxide film 93 remains in the MTJ devices MD9 in addition to the deposit-or-the-like deposition film 92.

As mentioned above, the conventional step (5) of forming the MTJ devices MD9 and the upper electrodes ET9 has various harmful effects on the MTJ devices MD9 as in the above-mentioned regions R1 to R9. As a result, a problem that an MTJ device excellent in operating characteristics cannot be obtained arises.

The invention has been made to solve the above problem and it is an object of the invention to obtain a semiconductor device having MTJ devices excellent in operating characteristics and a manufacturing method for the semiconductor device.

According to an embodiment of the invention, the following is implemented. In the laminated structure of MTJ devices, an upper magnetic film contains boron as a constituent material and a tunnel insulating film contains a noncrystalline constituent material. A CAP layer and a hard mask are laminated in this order over the above MTJ devices. The CAP layer contains a crystalline ruthenium simple substance as a constituent material and the hard mask contains a tantalum simple substance as a constituent material. The hard mask is so formed that the film thickness thereof is larger than that of the CAP layer.

In MRAM in this embodiment, a laminated structure comprised of a CAP layer and a hard mask is formed over MTJ devices. Then a crystalline Ru simple substance is used as a constituent material of the CAP layer and a Ta simple substance is used as a constituent material of the hard mask.

As a result, the following effect is produced: a semiconductor device having MTJ devices excellent in operating characteristics can be obtained by suppressing variation in the write current of the MTJ devices and accurately setting coercive force Hc.

BRIEF DESCRIPTION OF THE DRAWINGS

FIG. 16A is a sectional view illustrating a second manufacturing method for MARAM in the first embodiment;

FIG. 16B is a sectional view illustrating the second manufacturing method for MARAM in the first embodiment;

FIG. 17A is a sectional view illustrating the second manufacturing method for MARAM in the first embodiment;

FIG. 17B is a sectional view illustrating the second manufacturing method for MARAM in the first embodiment;

FIG. 18A is a sectional view illustrating the second manufacturing method for MARAM in the first embodiment;

FIG. 18B is a sectional view illustrating the second manufacturing method for MARAM in the first embodiment;

FIG. 19A is a sectional view illustrating the second manufacturing method for MARAM in the first embodiment;

FIG. 19B is a sectional view illustrating the second manufacturing method for MARAM in the first embodiment;

FIG. 20A is a sectional view illustrating the second manufacturing method for MARAM in the first embodiment;

FIG. 20B is a sectional view illustrating the second manufacturing method for MARAM in the first embodiment;

FIG. 26A is a sectional view illustrating a manufacturing method for MARAM in the second embodiment;

FIG. 26B is a sectional view illustrating the manufacturing method for MARAM in the second embodiment;

FIG. 27A is a sectional view illustrating the manufacturing method for MARAM in the second embodiment;

FIG. 27B is a sectional view illustrating the manufacturing method for MARAM in the second embodiment;

DETAILED DESCRIPTION OF THE PREFERRED EMBODIMENTS

First Embodiment

Figure 1:
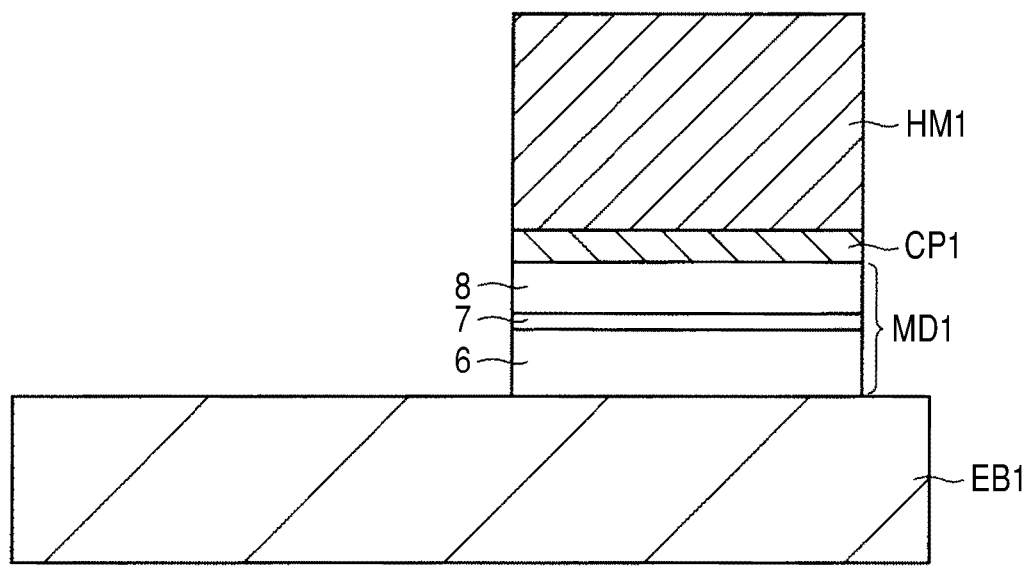
FIG. 1 is a sectional view illustrating the configuration of a memory device as a unit in MRAM in a first embodiment of the invention.

FIG. 1 is a sectional view illustrating the configuration of a memory device as a unit in MRAM in the first embodiment of the invention.

Figure 30:
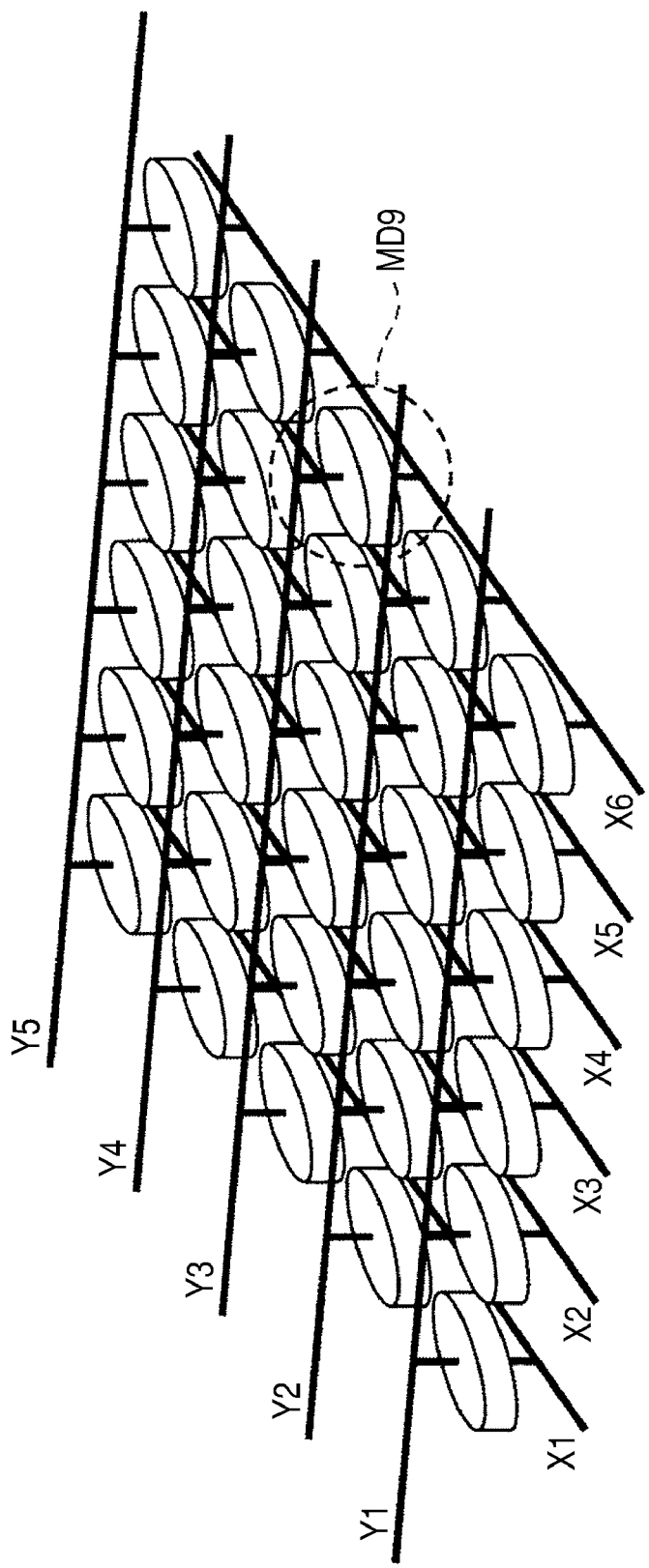
FIG. 30 is an explanatory drawing illustrating the outline of a conventional MRAM configuration.
Figure 31:
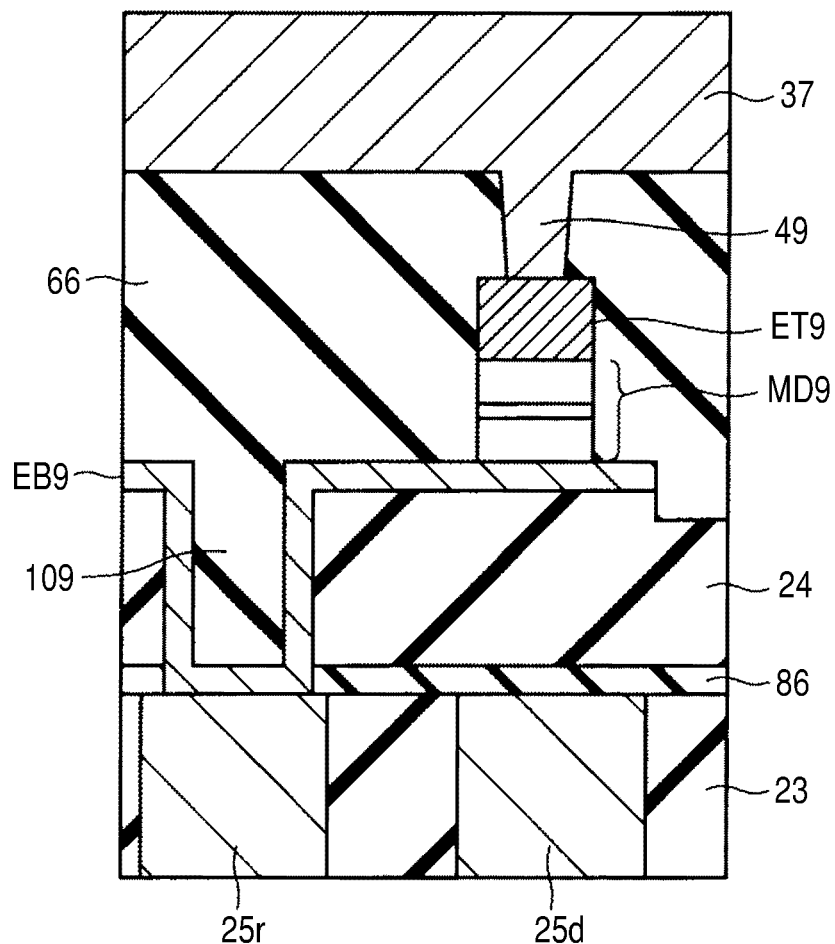
FIG. 31 is a sectional view illustrating the details of coupling relation between a conventional MTJ device and upper and lower wirings.
Figure 32:
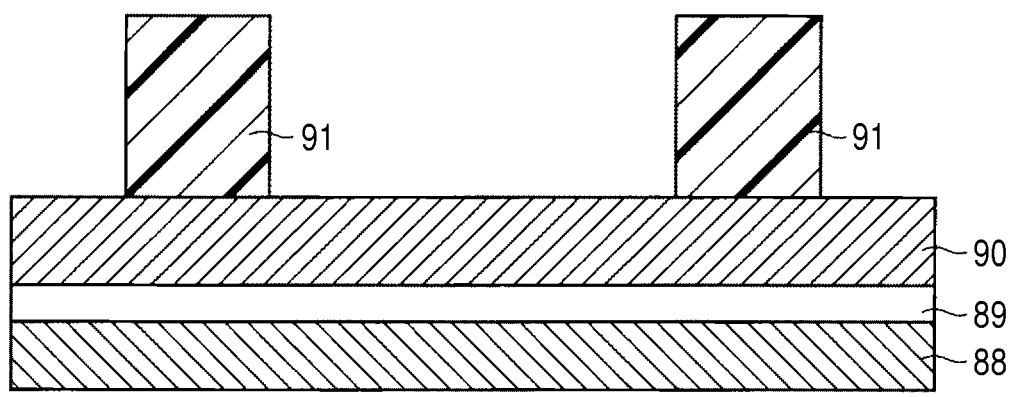
FIG. 32 is a sectional view illustrating part of a manufacturing process for a conventional MRAM.
Figure 33:
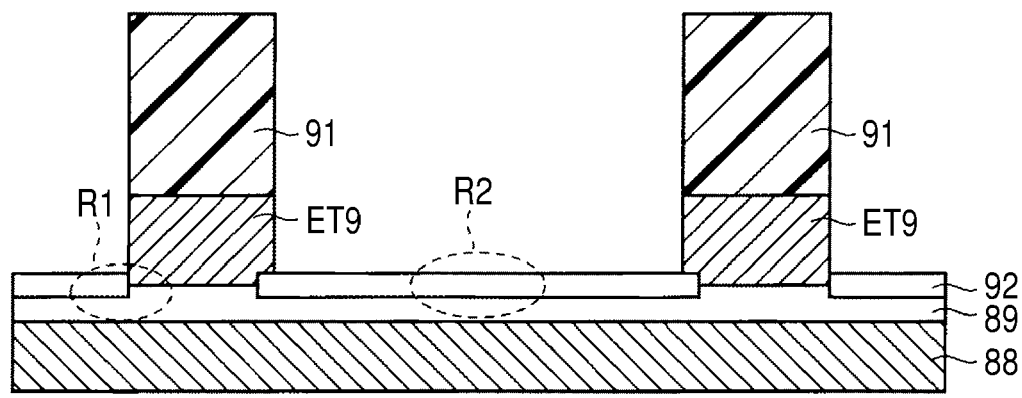
FIG. 33 is a sectional view illustrating part of the manufacturing process for the conventional MRAM.
Figure 34:
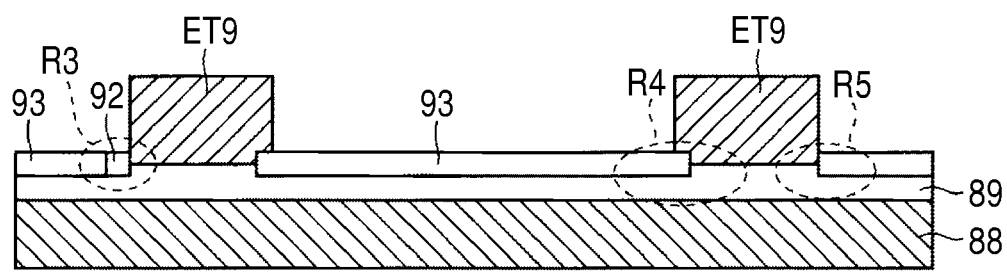
FIG. 34 is a sectional view illustrating part of the manufacturing process for the conventional MRAM.
Figure 35:
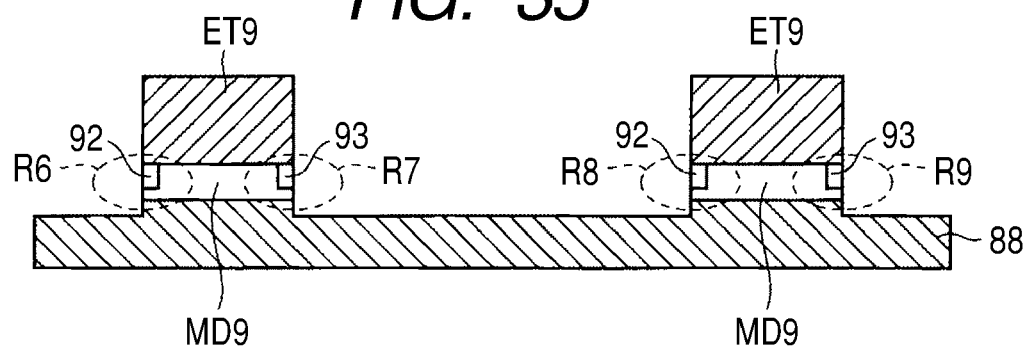
FIG. 35 is a sectional view illustrating part of the manufacturing process for the conventional MRAM.

As illustrated in the drawing, a metal film strap EB1 that makes a lower electrode is formed above a semiconductor substrate (not shown) and an MTJ device MD1 is formed over part of the surface of the metal film strap EB1. In reality, multiple MTJ devices MD1 are provided in a matrix pattern like the MTJ devices MD9 illustrated in FIG. 30.

The MTJ device MD1 is formed of a laminated structure obtained by laminating a lower magnetic film (pin layer) 6, a tunnel insulating film 7, and an upper magnetic film (free layer) 8 in this order. The lower magnetic film 6 and the upper magnetic film 8 contain noncrystalline (or microcrystalline) ferrocobalt boron (CoFeB) as a constituent material. As a constituent material of the magnetic films, a noncrystalline magnetic film containing B obtained by adding B to a compound containing at least two metals selected from among Co, Fe, and Ni can be applied. The tunnel insulating film 7 contains noncrystalline aluminum oxide ($AlO_x$) as a constituent material. A possible constituent material of the tunnel insulating film 7 is crystalline magnesium oxide (MgO).

In this specification, the term "noncrystalline" means an amorphous state or a state in which fine crystals are dispersed in an amorphous state, not a single-crystal state or a polycrystalline state. In case of state in which fine crystals are dispersed in an amorphous state, those in which a crystalline peak is substantially not observed by, for example, X-ray diffraction can be designated as "noncrystalline."

The upper magnetic film 8 formed of CoFeB has such a property that reduction in B concentration is caused by dispersion of B due to damage or heat load encountered during a manufacturing process. When the B concentration is lowered, the crystallization of CoFeB is accelerated and harmful effect is exercised on the write current Isw, resistance, MR (Magneto-Resistance) ratio in each MTJ device MD1. This embodiment is intended to avoid the production of the above harmful effect. To maintain the noncrystallinity of CoFeB, it is desirable that the tunnel insulating film should also be noncrystalline.

A CAP layer CP1 (first protective film) is formed over the upper magnetic film 8 of the MTJ device MD1 and a hard mask HM1 (second protective film) is formed over the CAP layer CP1. The CAP layer CP1 contains a crystalline ruthenium (Ru) simple substance as a constituent material and the hard mask HM1 contains a crystalline tantalum (Ta) simple substance as a constituent material.

The CAP layer CP1 and the hard mask HM1 function as a protective film or a hard mask when the MTJ device MD1 is formed during production and function as an upper electrode of the MTJ device MD1 after manufacture. The CAP layer CP1 (first protective film) also has a function of suppressing the diffusion of B from ferrocobalt boron (CoFeB).

Figure 2:
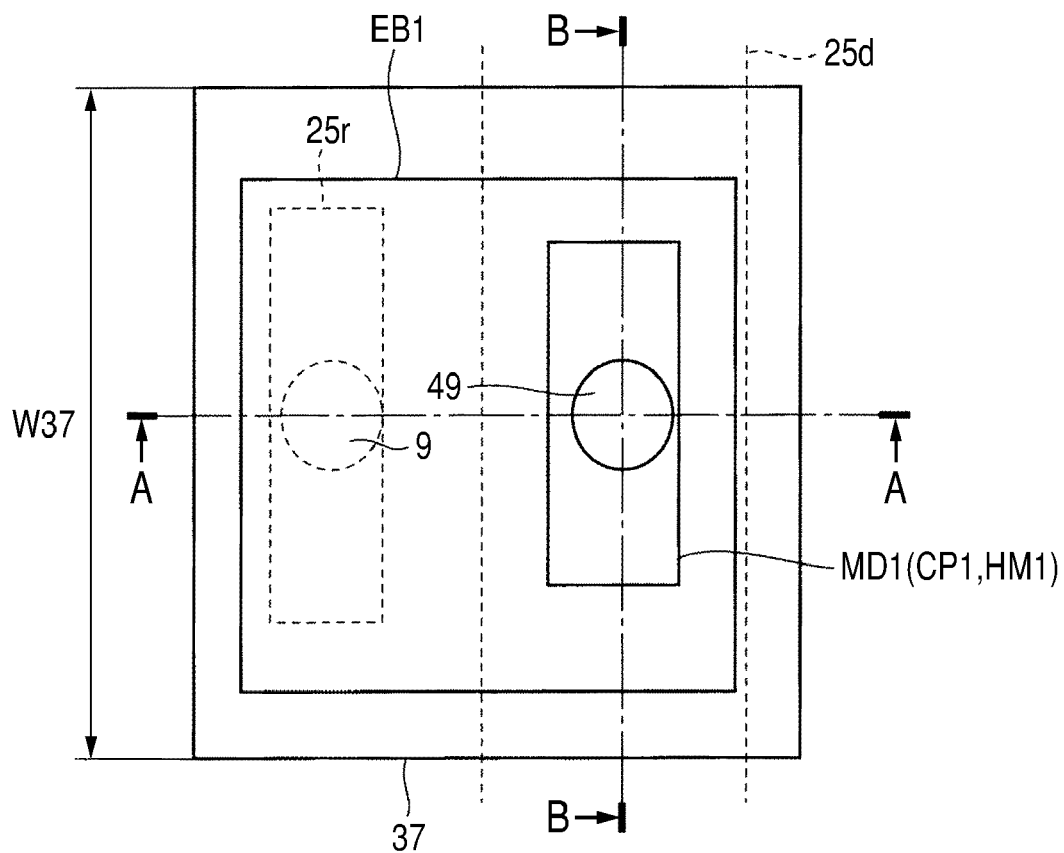
FIG. 2 is a plan view corresponding to the memory device configuration in the MRAM in the first embodiment illustrated in FIG. 1.

FIG. 2 is a plan view corresponding to the memory device configuration of the MRAM in the first embodiment illustrated in FIG. 1. The section taken along line A-A of FIG. 2 is equivalent to FIG. 1.

The metal film strap EB1 is electrically coupled with a read line 25r positioned beneath through a via hole 9. The MTJ device MD1 (including the CAP layer CP1 and the hard mask HM1) is formed above a digit line 25d and is electrically coupled with an upper Cu wiring 37 (formation width: W37) positioned above through a via hole 49.

Figure 3A:
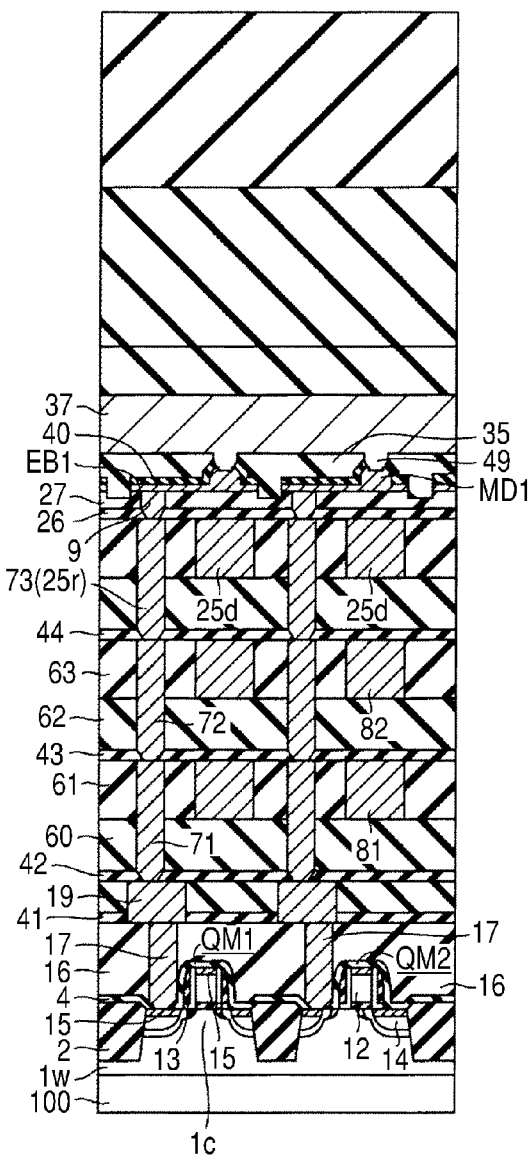
FIG. 3A is a sectional view illustrating the detailed structure of a memory cell portion of the MRAM in the first embodiment.
Figure 3B:
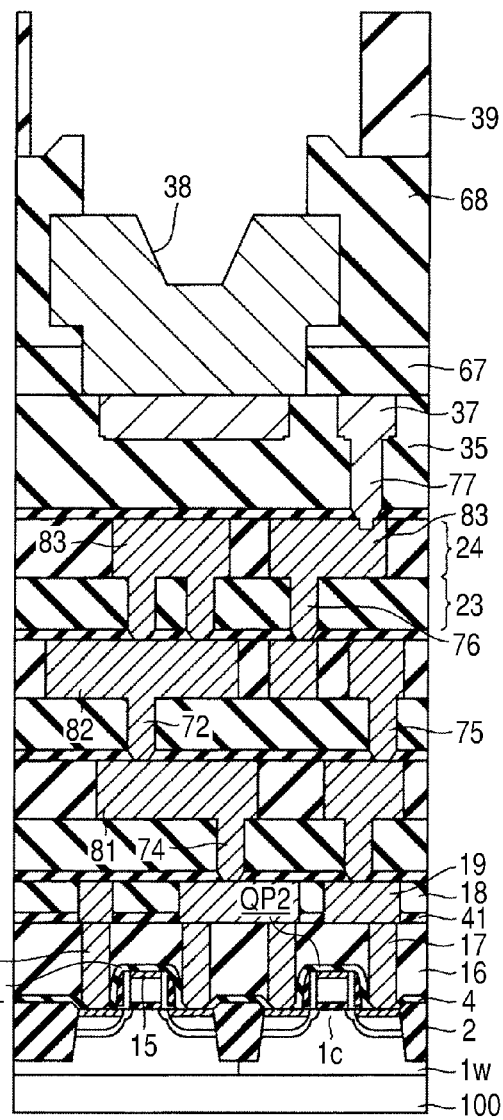
FIG. 3B is a sectional view illustrating the detailed structure of a peripheral circuit portion of the MRAM in the first embodiment.

FIGS. 3A and 3B are sectional views illustrating the detailed structures of a memory cell portion and a peripheral circuit portion of MRAM in the first embodiment. FIG. 3A illustrates a memory cell portion and FIG. 3B illustrates a peripheral circuit portion. FIG. 3A illustrates a cross section structure along the section taken along line A-A of FIG. 2.

Hereafter, description will be given to the detailed structure of the MRAM in the first embodiment with reference to FIGS. 3A and 3B. Detailed description will be given to the structure of the memory cell portion illustrated in FIG. 3A for the sake of convenience of description. With respect to the peripheral circuit portion illustrated in FIG. 3B, the description of portions common to the memory cell portion will be appropriately omitted and supplementary description will be given as required.

As illustrated in FIG. 3A, element isolation regions 2 are selectively formed in the upper part of a semiconductor substrate 100 and the well region 1w between the element isolation regions 2, 2 functions as a transistor formation region. In the transistor formation region, a pair of source/drain regions 14, 14 are formed with a channel region 1c in-between. A gate insulating film 11 and a gate electrode 12 are laminated over the channel region 1c and a side wall 13 of two-layer structure is formed on the side face of the gate electrode 12. A cobalt silicide region 15 is formed over each of the source/drain regions 14 and the gate electrode 12.

MOS transistors QM1 and QM2 for selection during read are configured of the channel region 1c, gate insulating film 11, gate electrode 12, side wall 13 and source/drain regions 14.

As illustrated in FIG. 3B, MOS transistors QP1 and QP2 are formed in the peripheral circuit portion like the MOS transistors QM1 and QM2.

Such an interlayer insulating film 16 comprised of an oxide film, such as TEOS, of $SiO_2$ or the like is formed so that the entire upper face of the semiconductor substrate 100 including the MOS transistors QM1, QM2, QP1, and QP2 is covered therewith. Multiple contact plugs 17 are formed so that they penetrate the interlayer insulating film 16. The contact plugs 17 are electrically coupled with the cobalt silicide region 15 of either of the pair of source/drain regions 14, 14 of each of the MOS transistors QM1, QM2, QP1, and QP2.

An interlayer insulating film 18 comprised of a nitride film 41 and an oxide film is laminated over the interlayer insulating film 16. Cu wirings 19 are formed so that they penetrate the nitride film 41 and the interlayer insulating film 18 and one Cu wiring 19 is electrically coupled with a contact plug 17.

Over the interlayer insulating film 18 including the Cu wirings 19, an underlying insulating film 42 comprised of a nitride film and interlayer insulating films 60 and 61 comprised of an oxide film are laminated. Contact plugs are formed so that they penetrate the underlying insulating film 42 and the interlayer insulating films 60 and 61; Cu wirings 81 are formed so that they penetrate the interlayer insulating film 61; and contact plugs 74 are formed so that they penetrate the underlying insulating film 42 and the interlayer insulating film 60. The contact plugs 74 are electrically coupled to the Cu wirings 81. The contact plugs 71, 74 are electrically coupled with the Cu wirings 19 (Cu wirings 19 electrically coupled with the contact plugs 17).

Over the interlayer insulating film 61 including the contact plugs 71 and the Cu wirings 81, an underlying insulating film 43 comprised of a nitride film and interlayer insulating films 62 and 63 comprised of an oxide film are laminated. Contact plugs 72 are formed so that they penetrate the underlying insulating film 43 and the interlayer insulating films 62 and 63; Cu wirings 82 are formed so that they penetrate the interlayer insulating film 63; and contact plugs 75 are formed so that they penetrate the underlying insulating film 43 and the interlayer insulating film 62. The contact plugs 75 are electrically coupled to the Cu wirings 82. The contact plugs 72 are electrically coupled to the contact plugs 71 and the contact plugs 75 are electrically coupled with the Cu wirings 81 (Cu wirings 81 electrically coupled with the contact plugs 74).

Over the interlayer insulating film 63 including the contact plugs 72 and the Cu wirings 82, an underlying insulating film 44 comprised of a nitride film and interlayer insulating films 23 and 24 comprised of an oxide film are laminated. Contact plugs 73 are formed so that they penetrate the underlying insulating film 44 and the interlayer insulating films 23 and 24; digit lines 25d and Cu wirings 83 are formed so that they penetrate the interlayer insulating film 24; and contact plugs 76 are formed so that they penetrate the underlying insulating film 44 and the interlayer insulating film 23. These contact plugs 73 make the read lines 25r. The contact plugs 76 are electrically coupled to the Cu wirings 83. The contact plugs 73 are electrically coupled to the contact plugs 72 and the contact plugs 76 are electrically coupled with some of the Cu wirings 83.

Over the interlayer insulating film 24 including the digit lines 25d, contact plugs 73 (read lines 25r), and Cu wirings 83, an interlayer insulating film 26 comprised of a nitride film and an interlayer insulating film 27 comprised of an oxide film are laminated. Over the read lines 25r (contact plugs 73) as viewed on a plane, via holes 9 are provided so that they penetrate the underlying insulating film 26 and the interlayer insulating film 27. A metal film strap EB1 is selectively formed over the interlayer insulating film 27 and in the via holes 9 and as a result, the metal film strap EB1 is electrically coupled with the read lines 25r (contact plugs 72) through the via holes 9. The metal film strap EB1 may also be designated as the lower electrode or extraction wiring of the MTJ device MD1.

Over the metal film strap EB1, the MTJ devices MD1 and the CAP layer CP1 and the hard mask HM1 (neither of which is shown in the drawings) are selectively formed. They are formed in a region corresponding to some of formation regions for the digit lines 25d as viewed on a plane.

An over-MTJ insulating film 40 formed of LT (Low Temperature)-SiN is formed over the entire surfaces of the MTJ devices MD1 and the upper face of the metal film strap EB1. In addition, an interlayer insulating film 35 comprised of $SiO_2$ or the like is formed so that it covers the entire surface of the metal film strap EB1 including the side face by low-temperature HDP-CVD (High Density Plasma Chemical Vapor Deposition) at, for example, 300° C. or below.

The upper Cu wirings 37 that make bit lines are selectively formed in the upper part of the interlayer insulating film 35. The via holes 49 are formed in part of a region where the MTJ devices MD1 are formed as viewed on a plane so that they penetrate the over-MTJ insulating film 40 and the interlayer insulating film 35. These via holes 49 are also filled with the upper Cu wirings 37 and as a result, the upper Cu wirings 37 and the MTJ devices MD1 are electrically coupled with each other. Also in the peripheral circuit portion illustrated in FIG. 3B, meanwhile, the upper Cu wirings 37 are formed and some of them are electrically coupled with some of the Cu wirings 83 through the contact plugs 77.

Over the entire surface of the interlayer insulating film 35 including the upper Cu wirings 37, an interlayer insulating film 67 comprised of $SiO_2$ or the like is formed using low-temperature HDP-CVD at, for example, 300° C. or below. An interlayer insulating film 68 is formed over the interlayer insulating film 67 and further a passivation film 39 is formed over the interlayer insulating film 68. In the peripheral circuit portion illustrated in FIG. 3B, meanwhile, the interlayer insulating films 67 and 68 and the passivation film 39 are selectively perforated and an Al wiring 38 is provided over the upper Cu wirings 37 in the perforated regions.

(First Manufacturing Method)

The drawings from FIG. 4 to FIG. 19B are sectional views illustrating a first manufacturing method for the MRAM in the first embodiment illustrated in FIG. 1 to FIG. 3. Hereafter, description will be given to the details of the manufacture process for the MRAM with a focus on the memory cell portion with reference to these drawings.

Figure 4:
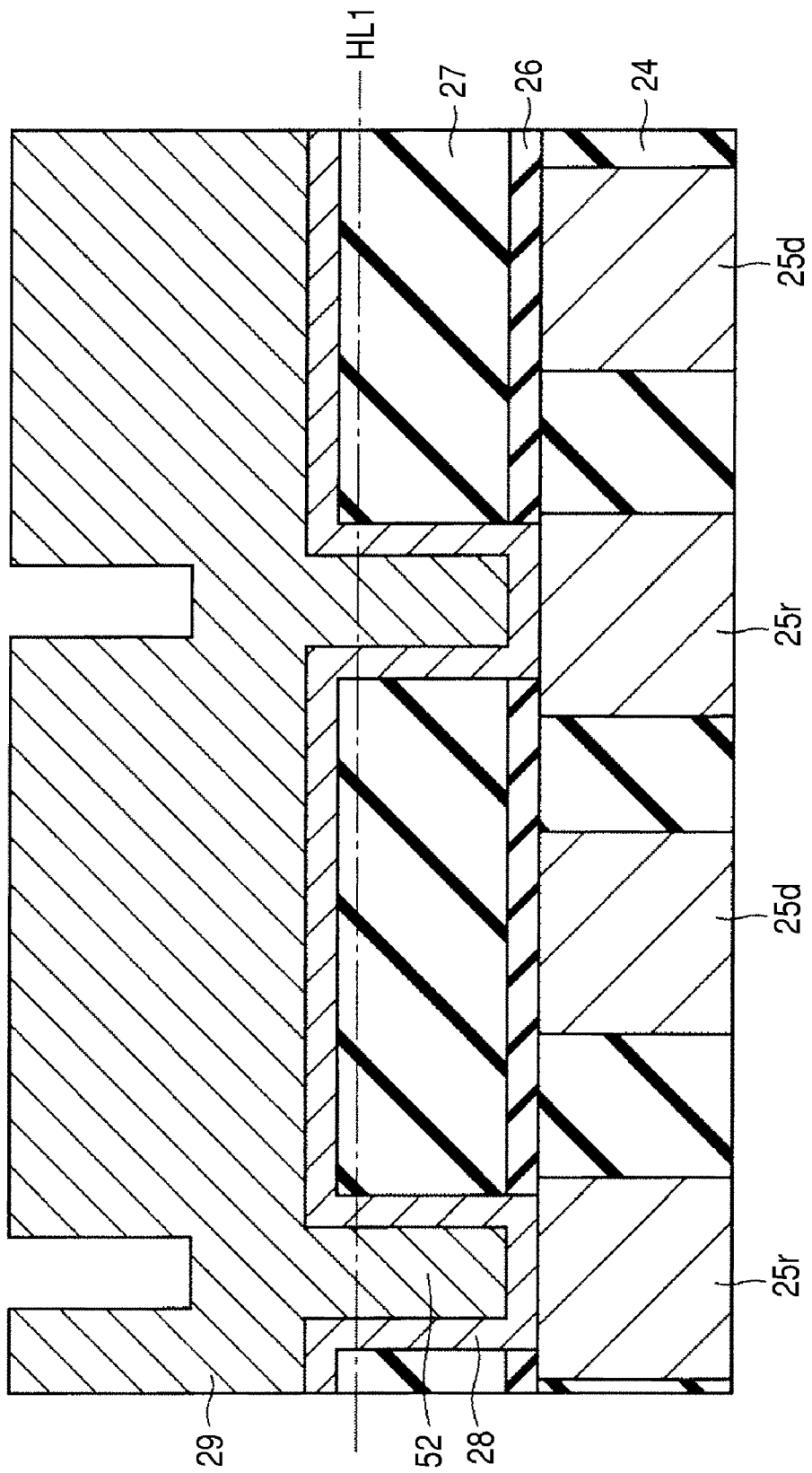
FIG. 4 is a sectional view illustrating a first manufacturing method for MRAM in the first embodiment.

First, the structure illustrated in FIG. 4 is obtained using an existing method. More specific description will be given. An underlying insulating film 26, 60 nm or so in film thickness, comprised of a nitride film is formed over the entire surface of an interlayer insulating film 24 including digit lines 25d and read lines 25r. An interlayer insulating film 27 comprised of an oxide film is formed over the underlying insulating film 26.

As illustrated in FIG. 4, thereafter, through holes 52 are formed using photolithography so that they penetrate the underlying insulating film 26 and the interlayer insulating film 27 over the read lines 25r as viewed on a plane. A barrier metal layer 28 is deposited over the entire surface including the interior of the through holes 52 and a via filling metal layer 29 comprised of tungsten (W) is deposited over the barrier metal layer 28 using CVD. CMP processing is carried out on the via filling metal layer 29 and the barrier metal layer 28 to remove the via filling metal layer 29 and the barrier metal layer 28 to a CMP process line HL1.

Figure 5:
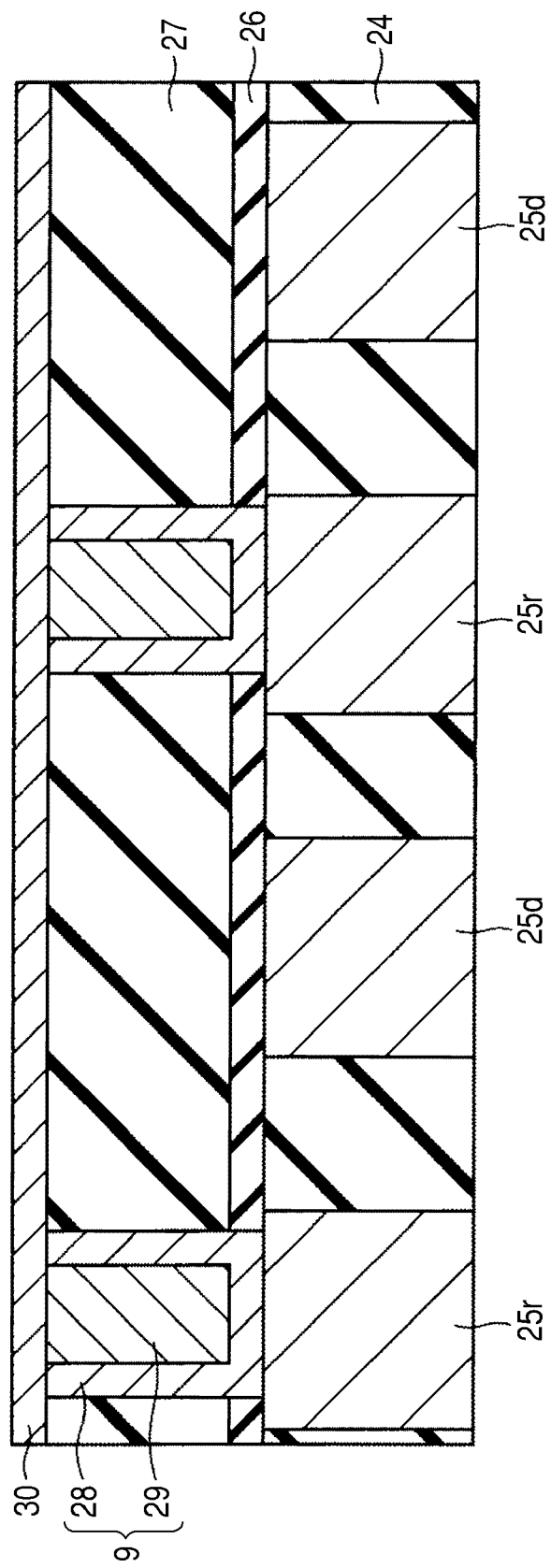
FIG. 5 is a sectional view illustrating the first manufacturing method for MRAM in the first embodiment.

As illustrated in FIG. 5, as a result, via holes 9 (local vias LV) comprised of the barrier metal layer 28 and the via filling metal layer 29 can be obtained in the through holes 52. A lower electrode layer 30 for metal film strap EB1 is formed over the entire surface. This lower conductive layer 30 is electrically coupled with the read lines 25r through the via holes 9.

Figure 6:
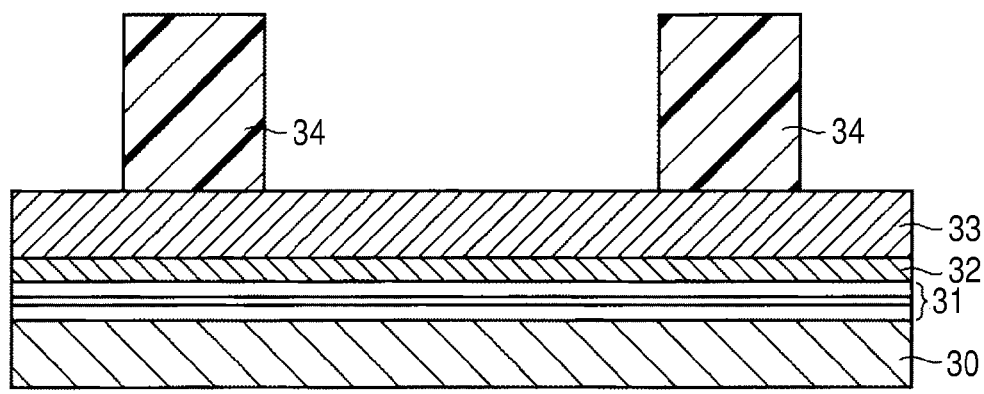
FIG. 6 is a sectional view illustrating the first manufacturing method for MRAM in the first embodiment.

As illustrated in FIG. 6, subsequently, a film 31 for MTJ, a first upper metal layer 32 (first conductive layer), and a second upper metal layer 33 (second conductive layer) are deposited in this order over the lower conductive layer 30.

The film 31 for MTJ has the laminated structure obtained by laminating the lower magnetic film 6, tunnel insulating film 7 and upper magnetic film 8 (not shown in FIG. 6) illustrated in FIG. 1 in this order. The lower magnetic film 6 and the upper magnetic film 8 contain noncrystalline CoFeB as a constituent material. As a constituent material of the magnetic films, a noncrystalline magnetic film containing B obtained by adding B to a compound containing at least two metals selected from among Co, Fe, and Ni can be applied. The tunnel insulating film 7 contains noncrystalline $AlO_x$ as a constituent material. Possible constituent materials of the tunnel insulating film 7 include crystalline magnesium oxide (MgO); however, it is desirable that the tunnel insulating film should also be noncrystalline to maintain the noncrystallinity of the magnetic films.

In addition, the first upper metal layer 32 is so formed that it is of crystalline Ru simple substance and is 5 to 10 nm in film thickness; and the second upper metal layer 33 is so formed that it is of crystalline tantalum (Ta) simple substance and is 40 to 80 nm in film thickness. Therefore, they are so formed that the second upper metal layer 33 is larger in film thickness than the first upper metal layer 32. Ta as a constituent material of the second upper metal layer 33 may be noncrystalline as long as it is a simple substance.

As illustrated in FIG. 6, resist is deposited over the second upper metal layer 33 and the resist is patterned to obtain resist patterns 34 using photolithography. The MTJ memory cell patterns of MTJ devices MD1, CAP layers CP1, and hard masks HM1 are defined by the resist patterns 34.

Figure 7:
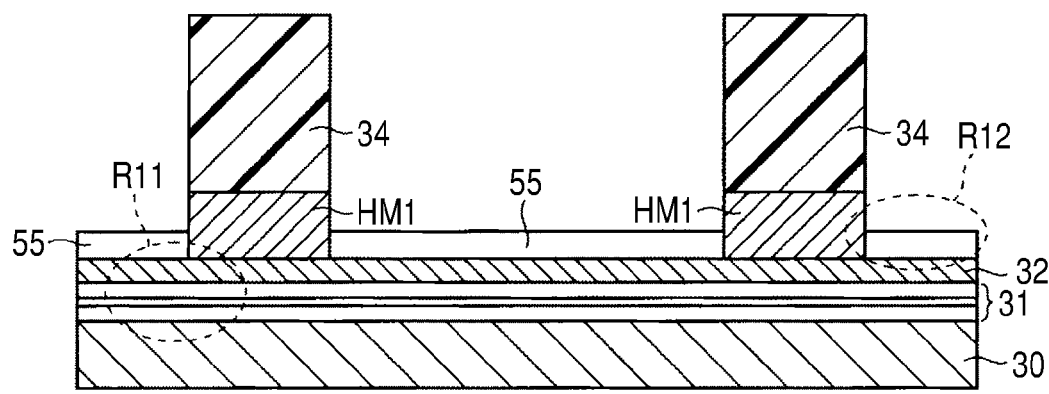
FIG. 7 is a sectional view illustrating the first manufacturing method for MRAM in the first embodiment.

As illustrated in FIG. 7, subsequently, the second upper metal layer 33 is processed by etching using the resist patterns 34 as a mask to obtain hard masks HM1.

At this time, the first upper metal layer 32 comprised of crystalline simple Ru has been formed over the entire surface of the film 31 for MTJ; therefore, the surface of the film 31 for MTJ (free layer surface) is not exposed to an etching gas atmosphere. In addition, since the first upper metal layer 32 has been formed over the film 31 for MTJ, it is possible to significantly reduce etching damage done to a region that makes a free layer in the film 31 for MTJ.

Therefore, etching damage is not done to or deposit or the like does not stick to a region that makes a free layer in the film 31 for MTJ in the region R11, R12, or the like.

In addition, a material having a high selection ratio between Ta as a constituent material of the second upper metal layer 33 and Ru as a constituent material of the first upper metal layer 32 can be selected as etching material. When the hard masks HM1 are formed, therefore, the first upper metal layer 32 that makes the CAP layers CP1 can be left without fail. FIG. 7 schematically depicts how a deposit-or-the-like deposition film 55 of Ta or the like is formed over the first upper metal layer 32.

Figure 8:
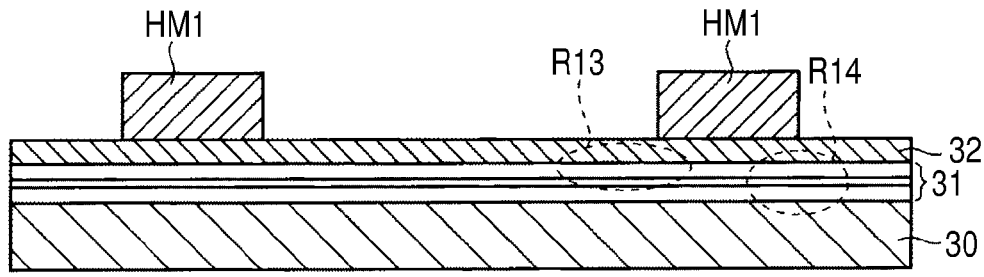
FIG. 8 is a sectional view illustrating the first manufacturing method for MRAM in the first embodiment.

As illustrated in FIG. 8, subsequently, the resist patterns 34 are removed by asking. Since the first upper metal layer 32 comprised of crystalline simple Ru has been formed over the entire surface of the film 31 for MTJ, the following does not take place in the region R13, R14, or the like: the surface of a region that makes a free layer in the film 31 for MTJ is oxidized or etching damage is done to the surface.

Figure 9:
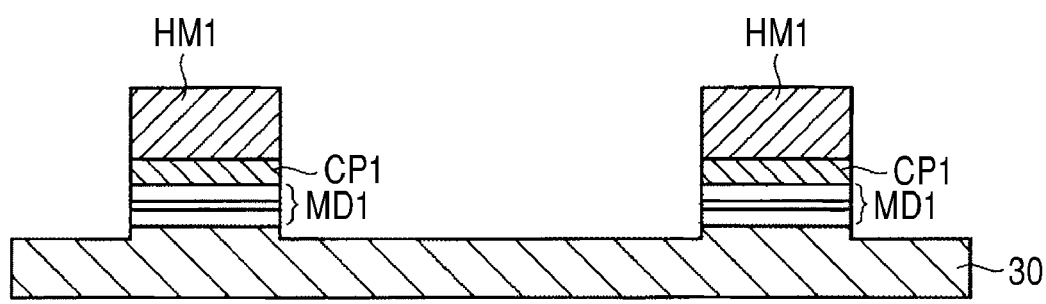
FIG. 9 is a sectional view illustrating the first manufacturing method for MRAM in the first embodiment.

As illustrated in FIG. 9, subsequently, the first upper metal layer 32 and the film 31 for MTJ are processed using the hard masks HM1 as a mask to obtain the CAP layers CP1 and the MTJ devices MD1.

Figure 10:
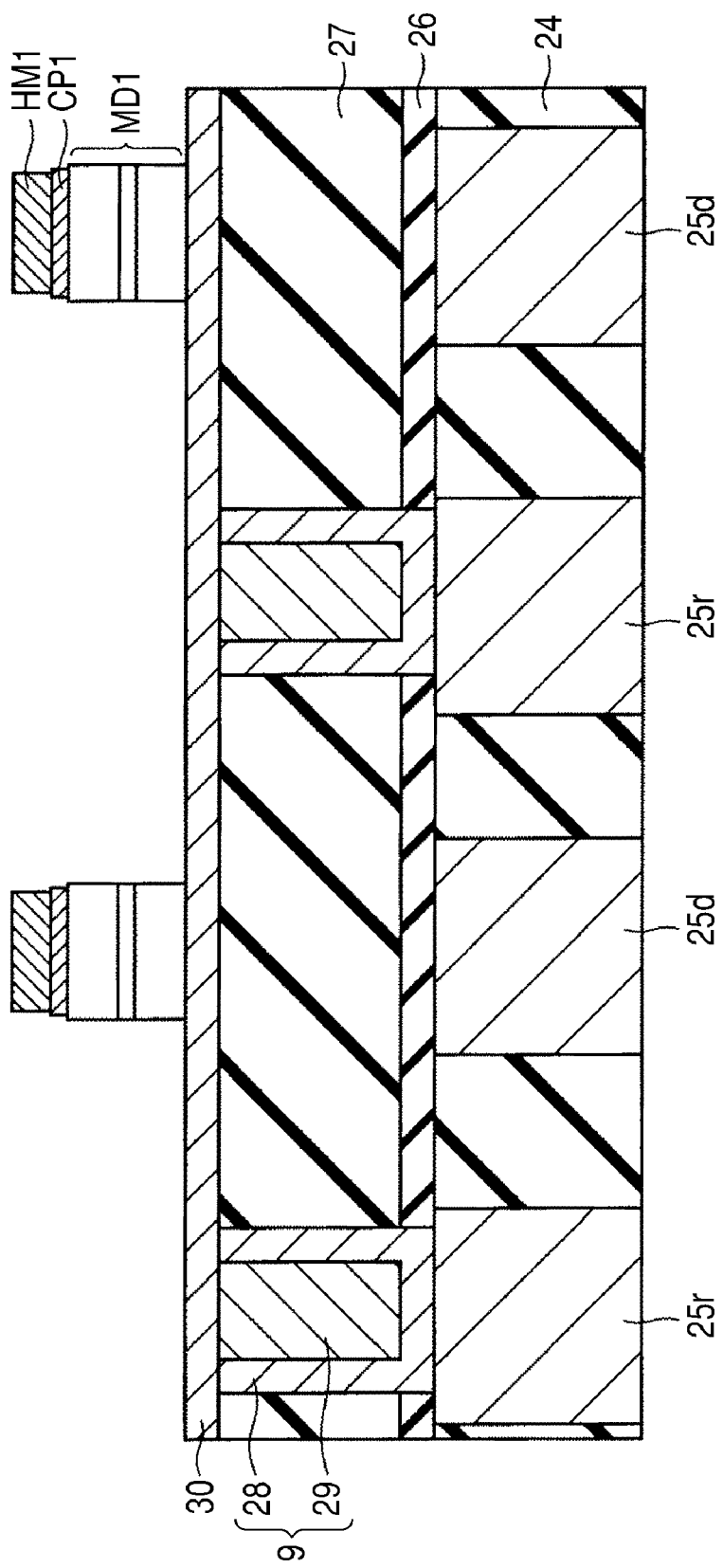
FIG. 10 is a sectional view illustrating the first manufacturing method for MRAM in the first embodiment.

As illustrated in FIG. 10, an MTJ device MD1 (including a CAP layer CP1 and a hard mask HM1) as a unit is provided above the digit lines 25d as viewed on a plane.

Figure 11:
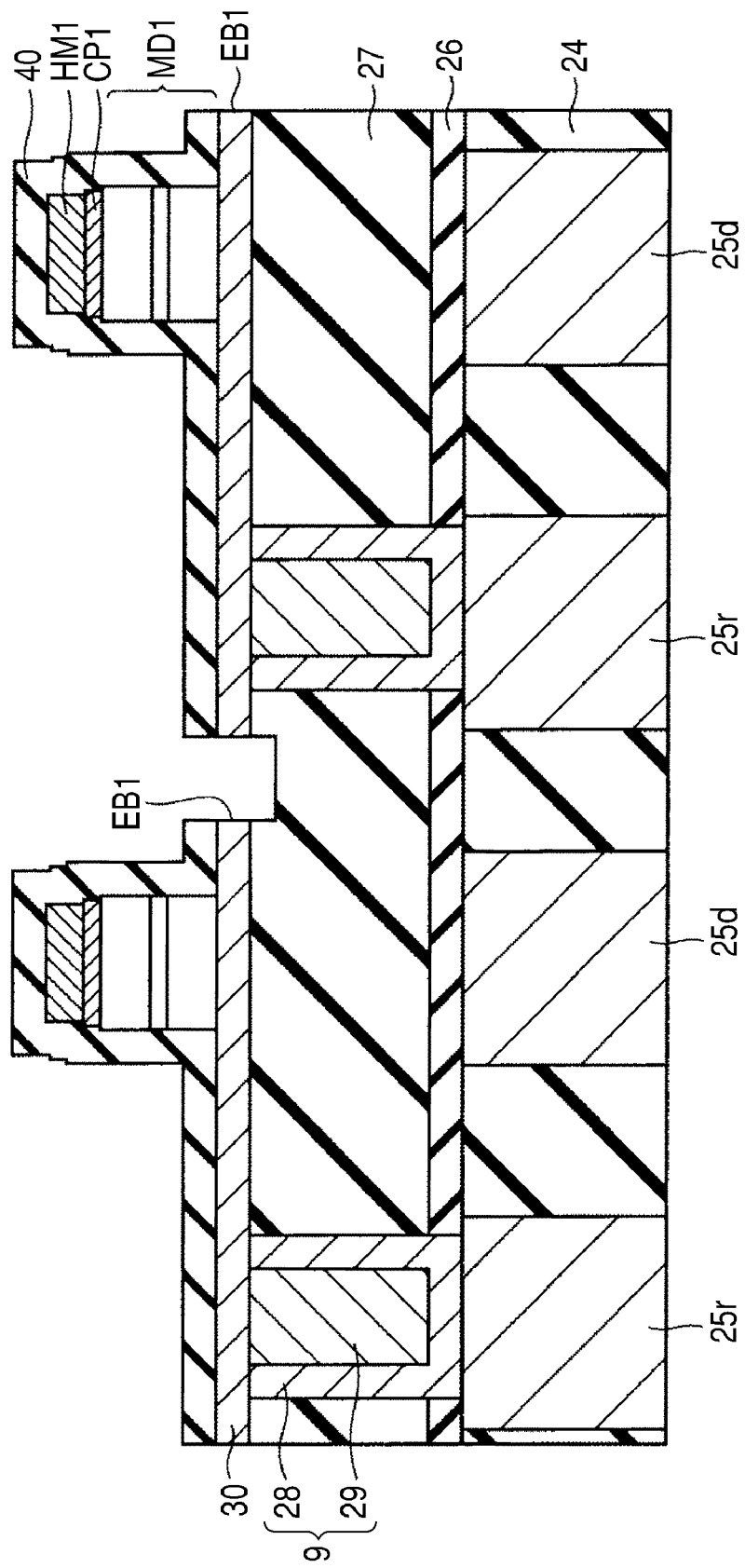
FIG. 11 is a sectional view illustrating the first manufacturing method for MRAM in the first embodiment.

As illustrated in FIG. 11, thereafter, an over-MTJ insulating film 40 comprised of a silicon nitride film is formed over the entire surface. At this time, the over-MTJ insulating film 40 is formed at the following temperature: a temperature at which the electric and magnetic characteristics of the magnetic material (CoFeB) configuring the lower magnetic film 6 and the upper magnetic film 8 in each MTJ device MD1 are not influenced (for example, a temperature not higher than 300° C.). This over-MTJ insulating film 40 is formed directly on the surface and side face of each MTJ device MD1.

The over-MTJ insulating film 40 and the lower conductive layer 30 are selectively patterned using photolithography. As a result, an independent metal film strap EB1 is formed for each MTJ device MD1 as a unit.

As mentioned above, the over-MTJ insulating film 40 and the lower electrode layer 30 are simultaneously patterned. Therefore, the surface and side face of each MTJ device MD1 are protected by the over-MTJ insulating film 40 when the lower electrode layer 30 is patterned. For this reason, the production of leakage current in the MTJ devices MD1 due to the residue of the lower electrode layer 30 sticking to the side face of an MTJ device MD1 or caused by other like reasons can be effectively suppressed.

Figure 12:
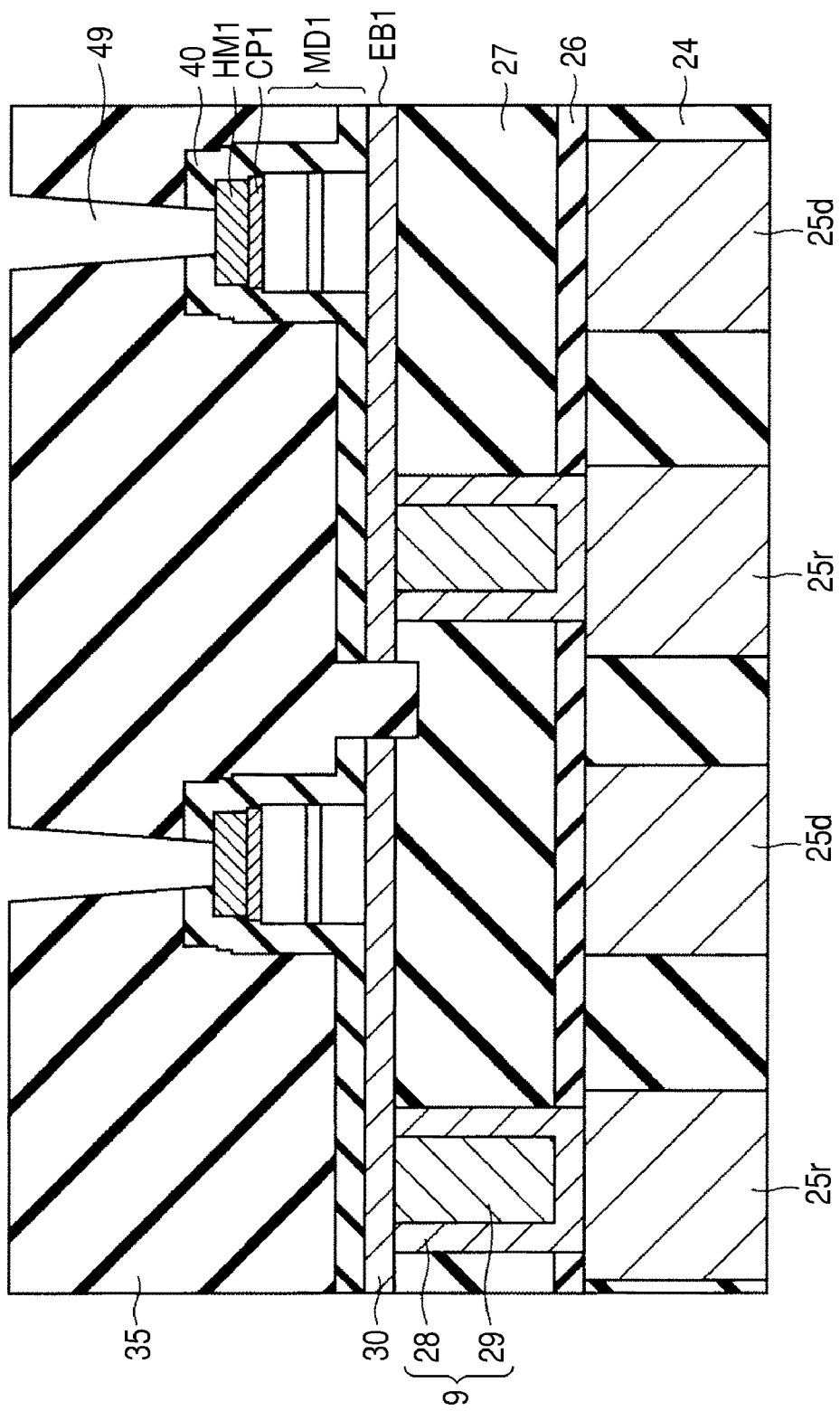
FIG. 12 is a sectional view illustrating the first manufacturing method for MRAM in the first embodiment.

As illustrated in FIG. 12, subsequently, an interlayer insulating film 35 comprised of $SiO_2$ is formed over the entire surface. At this time, low-temperature HDP-CVD at a temperature not higher than 300° C. is used to prevent the electric and magnetic characteristics of, for example, the magnetic material (CoFeB) from being influenced. The films formed at subsequent steps are also formed at a temperature not higher than 300° C. unless otherwise explicitly stated. Thereafter, CMP processing is carried out on the interlayer insulating film 35 to planarlize the interlayer insulating film 35. Subsequently, using etching using photolithography or the like, via holes 49 penetrating the interlayer insulating film 35 and the over-MTJ insulating film 40 above the hard masks HM1 are provided and further copper wiring buried regions are selectively formed in the interlayer insulating film 35.

When the via holes 49 are formed by etching, the CAP layers CP1 function as an etching stopper. That is, even though a hard mask HM1 is perforated by overetching, erosion by etching can be suppressed without fail by a CAP layer CP1 positioned beneath.

Figure 13:
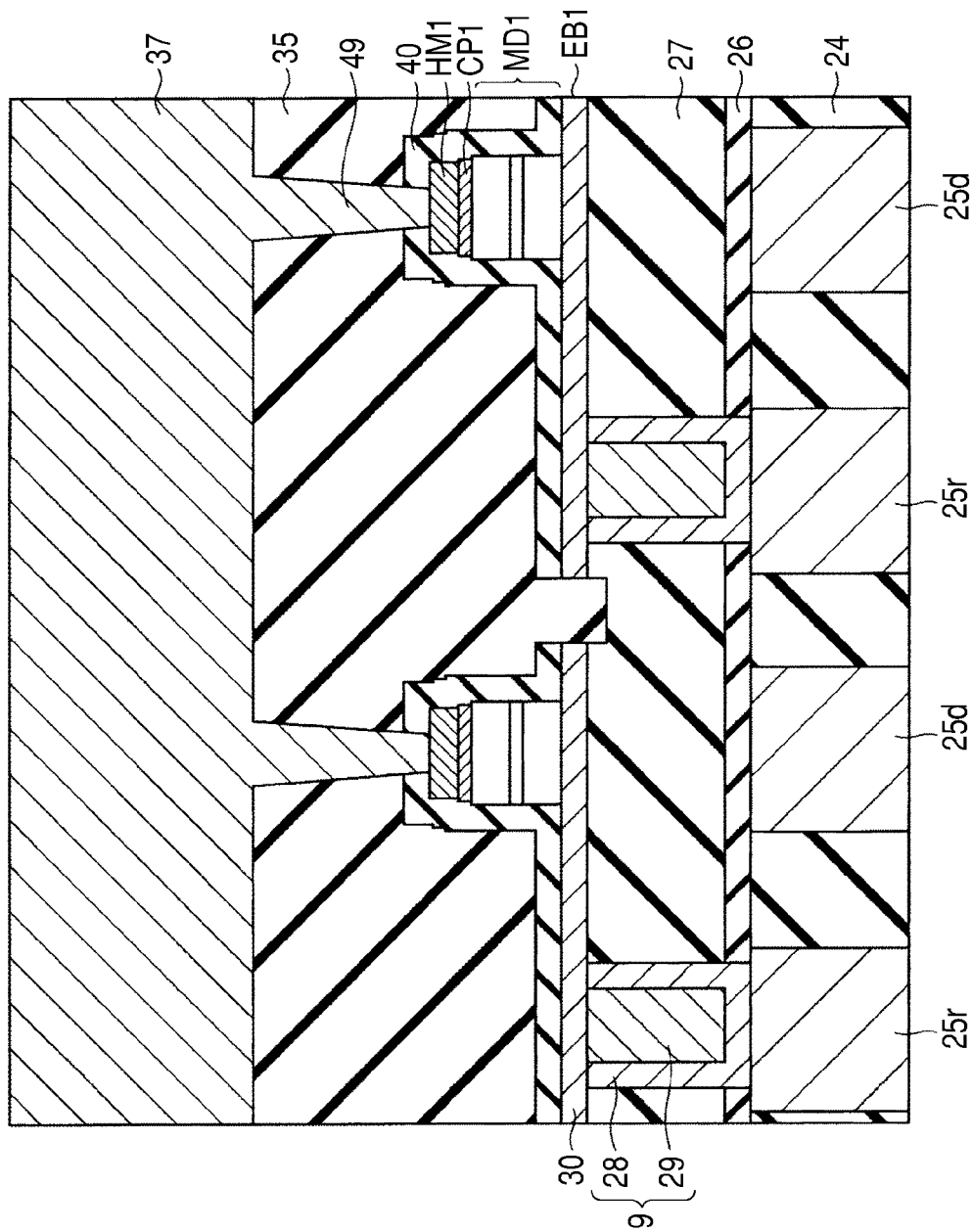
FIG. 13 is a sectional view illustrating the first manufacturing method for MRAM in the first embodiment.

Thereafter, a barrier metal layer (not shown) is deposited; Cu is deposited by plating; and CMP processing is carried out. As illustrated in FIG. 13, consequently, upper Cu wirings 37 (bit lines) are buried and formed in the via holes 49 as well as the interlayer insulating film 35. As a result, the upper Cu wirings 37 are electrically coupled with the hard masks HM1 of the MTJ devices MD1 through the via holes 49. Thus the upper Cu wirings 37 as fifth-layer metal wirings are formed. Therefore, the upper Cu wirings (including the barrier metal layer) formed in the via holes 49 become electrical coupling portions formed over the surfaces of the hard masks HM1. In addition, the upper Cu wirings 37 in the interlayer insulating film 35 and the via holes 49 become upper wiring portions electrically coupled with the MTJ devices MD1.

As mentioned above, favorable electrical coupling between the upper Cu wirings 37 buried and formed in the interlayer insulating film 35 and the hard masks HM1 can be achieved through the via holes 49.

Figure 14:
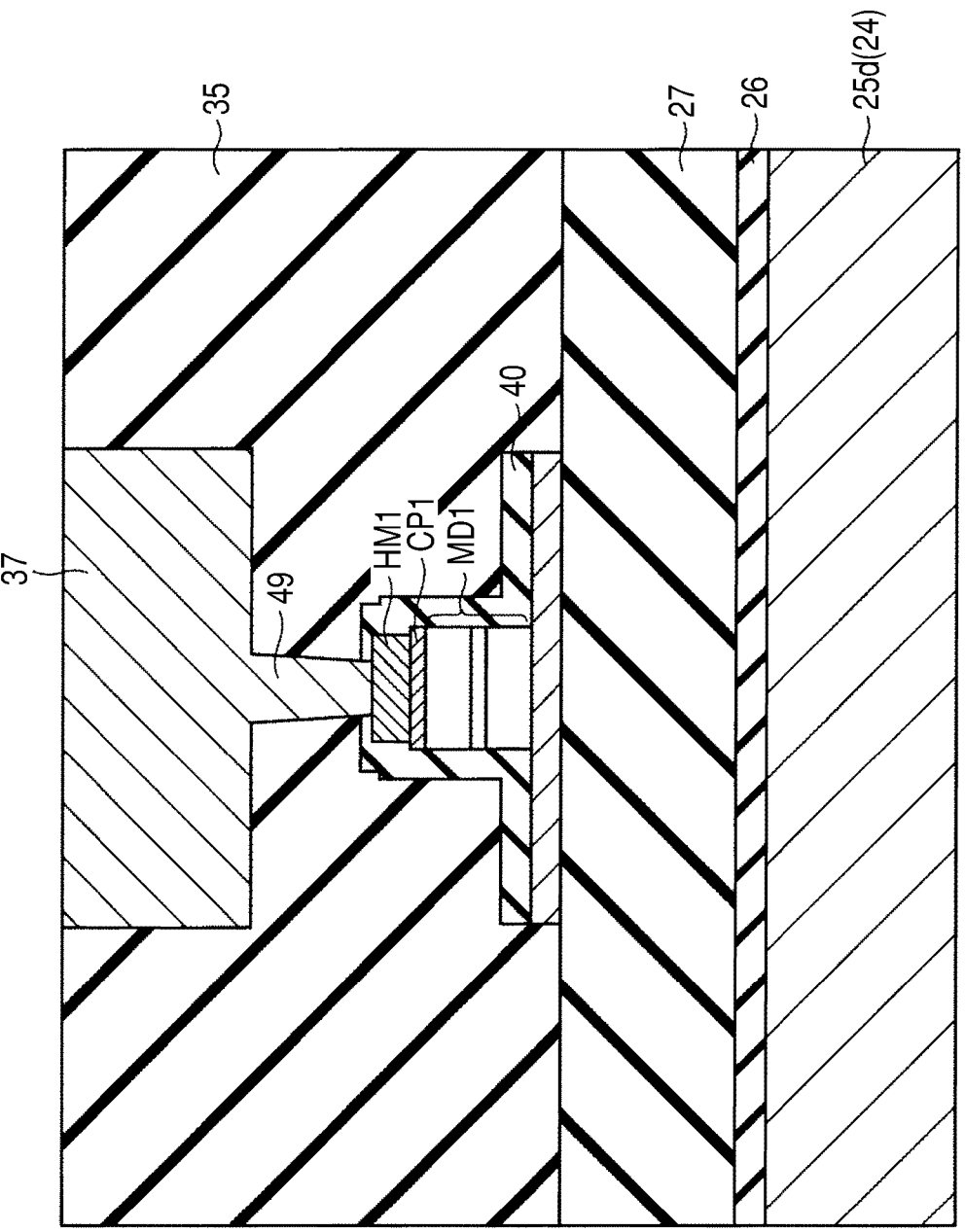
FIG. 14 is a sectional view illustrating the first manufacturing method for MRAM in the first embodiment.

FIG. 14 is a sectional view illustrating the structure obtained after the formation of the upper Cu wirings 37 along the section taken along line B-B of FIG. 2. As illustrated in the drawing, the upper Cu wirings 37 are selectively buried and formed in the upper part of the interlayer insulating film 35.

Finally, an interlayer insulating film (not shown) is formed over the entire surface. This completes the MRAM in the first embodiment in which the hard mask HM1, CAP layer CP1, MTJ device MD1, and metal film strap EB1 illustrated in FIG. 1 to FIG. 3 are used as a memory cell.

Figure 15:
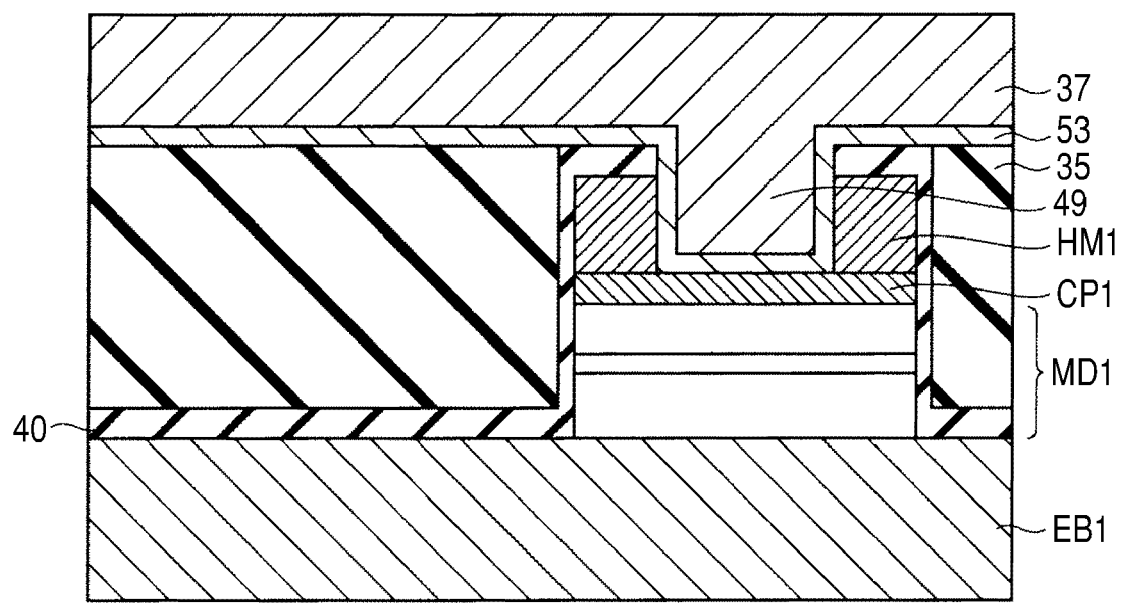
FIG. 15 is a sectional view illustrating the etching stopper effect of a CAP layer in the first manufacturing method in the first embodiment.

FIG. 15 illustrates a structure obtained when not only the over-MTJ insulating film 40 but also a hard mask HM1 is perforated by overetching during the formation of the via holes 49. Also in this case, the CAP layers CP1 function as an etching stopper and thus erosion by etching is held back at the CAP layers CP1 without fail. As mentioned above, the CAP layers CP1 function as an etching stopper when the via holes 49 are formed. This makes it possible to enhance an etching margin when the via holes 49 and the upper Cu wirings 37 are formed. The presence of the CAP layers CP1 makes it possible to reduce etching damage done to the MTJ devices MD1 when the via holes 49 are formed.

FIG. 15 depicts a situation in which a barrier metal layer 53 is formed under the upper Cu wirings 37 including the via holes 49.

(Second Manufacturing Method)

The drawings from FIG. 16A to FIG. 20B are sectional views illustrating a second manufacturing method for MARAM in the first embodiment. FIGS. 16A, 17A, 18A, 19A, and 20A illustrate the structure of a memory cell portion and FIGS. 16B, 17B, 18B, 19B, and 20B illustrate the structure of a peripheral circuit portion. Hereafter, description will be given to the second manufacturing method with reference to these drawings.

First, the same processes as in the first manufacturing method illustrated in FIG. 4 to FIG. 11 are followed. Then an interlayer insulating film 35 comprised of $SiO_2$ is formed over the entire surface as illustrated in FIGS. 16A and 16B. In the peripheral circuit portion, nothing is formed over the interlayer insulating film 27 and thus the interlayer insulating film 35 is formed over the entire surface of the interlayer insulating film 27.

As illustrated in FIGS. 16A and 16B, thereafter, CMP processing is carried out on the interlayer insulating film to planarize the interlayer insulating film 35. Subsequently, etching using photolithography or the like is carried out to selectively form via holes 49 penetrating the interlayer insulating film 35 and the over-MTJ insulating film 40 above the hard masks HM1.

When the via holes 49 are formed by etching, the CAP layers CP1 function as an etching stopper as in the first manufacturing method. In the peripheral circuit portion, meanwhile, no via holes 49 are formed.

As illustrated in FIGS. 17A and 17B, subsequently, a barrier metal layer (not shown) is deposited over the entire surface including the interior of the via holes 49 and Cu is deposited by plating. Thereafter, CMP processing is carried out to completely remove Cu from over the interlayer insulating film 35 and first Cu wirings 37a buried in the via holes 49 are thereby obtained. Therefore, the first Cu wirings 37a (including the barrier metal layer) formed in the via holes 49 become electrical coupling portions formed over the surfaces of the hard masks HM1.

As illustrated in FIGS. 18A and 18B, thereafter, an underlying insulating film 46 comprised of a silicon nitride film is deposited over the entire surface and an interlayer insulating film 47 comprised of an oxide film is further deposited over the underlying insulating film 46. In the peripheral circuit portion, etching using photolithography or the like is carried out to form via holes 48 penetrating the interlayer insulating film 47, underlying insulating film 46, and interlayer insulating film 35.

As illustrated in FIGS. 19A and 19B, further, the underlying insulating film 46 and the interlayer insulating film 47 are selectively removed by etching using photolithography. A Cu wiring buried region is formed in each of the memory cell portions and the peripheral circuit portions.

Thereafter, a barrier metal layer (not shown) is deposited and Cu is deposited by plating and CMP processing is carried out. Bit lines are thereby obtained in the memory cell portions as illustrated in FIG. 20A. The bit lines are obtained by burying second Cu wirings 37b in the interlayer insulating film 35 including the portions positioned over the first Cu wirings 37a. The first Cu wirings 37a and the second Cu wirings 37b become upper wiring portions electrically coupled with the MTJ devices MD1. In the peripheral circuit portions, meanwhile, upper Cu wirings 37 are buried and formed over the interlayer insulating film 35 including the interior of the via holes 48. As a result, the second Cu wirings 37b are electrically coupled with the hard masks HM1 of the MTJ devices MD1 through (the first Cu wirings 37a in) the via holes 49. Thus the upper Cu wirings 37 (37b) as fifth-layer metal wirings are formed.

Finally, an interlayer insulating film (not shown) is formed over the entire surface. This completes the MRAM in the first embodiment in which the hard mask HM1, CAP layer CP1, MTJ device MD1, and metal film strap EB1 illustrated in FIG. 1 to FIG. 3 are used as a memory cell.

Figure 21:
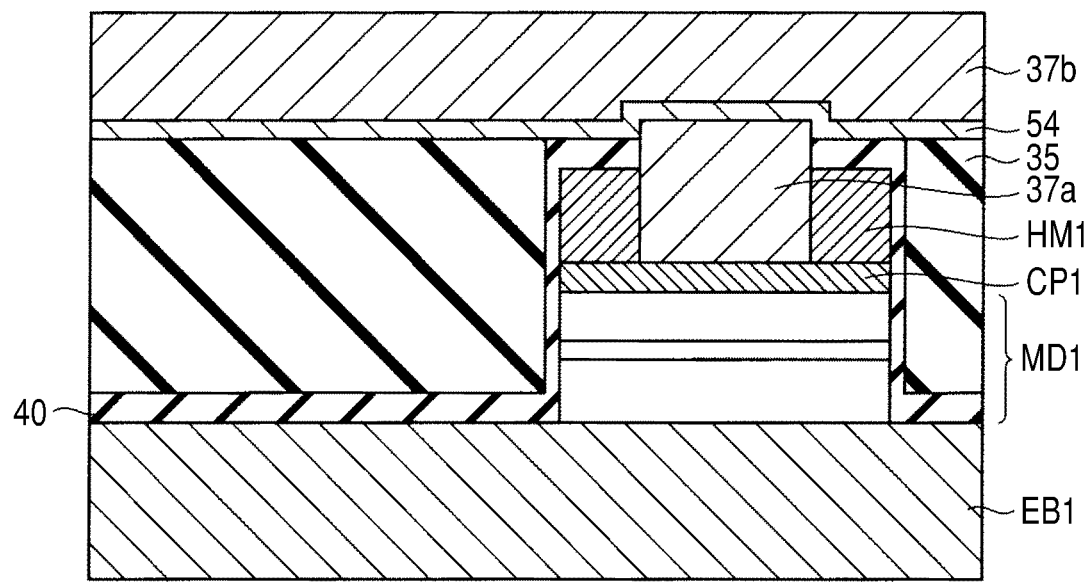
FIG. 21 is a sectional view illustrating the etching stopper effect of a CAP layer in the second manufacturing method in the first embodiment.

FIG. 21 illustrates a structure obtained when not only the over-MTJ insulating film 40 but also a hard mask HM1 is perforated by overetching during the formation of the via holes 49. Also in this case, the CAP layers CP1 are not eroded. As mentioned above, the CAP layers CP1 function as an etching stopper when the via holes 49 are formed. This makes it possible to enhance an etching margin when the via holes 49 and the upper Cu wirings 37 are formed. The presence of the CAP layers CP1 makes it possible to reduce etching damage done to the MTJ devices MD1 when the via holes 49 are formed.

FIG. 21 depicts a situation in which a barrier metal layer 54 is formed under the second Cu wirings 37b.

(Effect)

Figure 22:
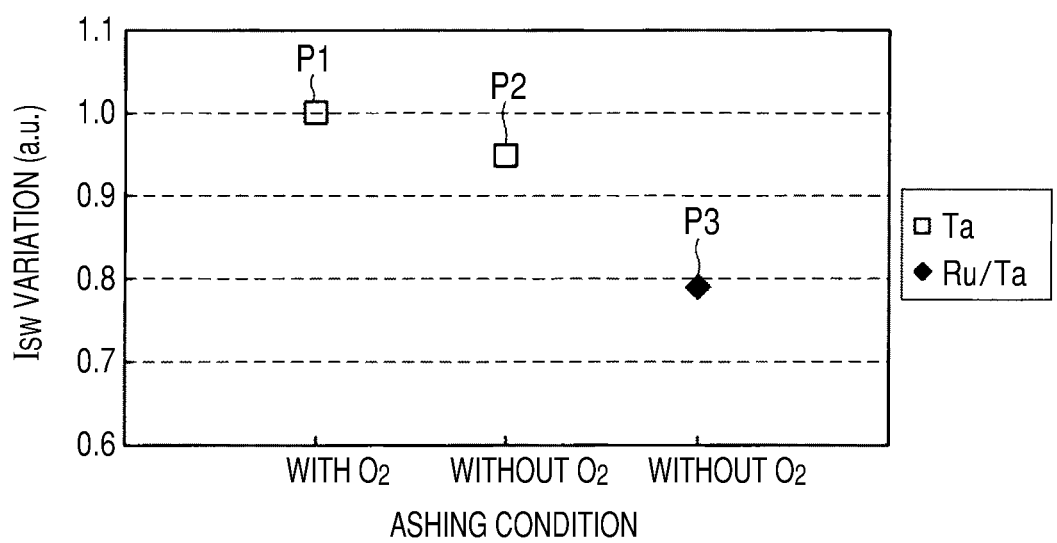
FIG. 22 is a graph indicating the material dependence and the process dependence of a CAP layer observed during the resist asking illustrated in FIG. 8.

FIG. 22 is a graph indicating the material dependence and the process dependence of a CAP layer CP1 observed during the resist ashing illustrated in FIG. 8. The horizontal axis indicates ashing conditions and the vertical axis indicates variation in write current Isw (a.u. (arbitrary unit). The graph shown in FIG. 22 indicates a case where the film thickness of the CAP layer CP1 is 5 nm.

In the drawing, measurement point P1 indicates a case where under an ashing condition involving use of oxygen gas ($O_2$), only a mask layer of tantalum material is used for the layer over the MTJ device. Measurement point P2 indicates a case where under an ashing condition involving use of ammonia gas without use of oxygen gas ($O_2$), only a mask layer of tantalum material is used for the layer over the MTJ device. Measurement point P3 indicates a case where under an ashing condition involving use of ammonia gas, the following laminated structure is used for the layer over the MTJ device MD1: a laminated structure of a CAP layer CP1 using a simple substance of crystalline Ru as a constituent material and a hard mask HM1 using a simple substance of crystalline Ta as a constituent material. That is, measurement point P3 indicates a case where the MTJ device is manufactured by the manufacturing method in the first embodiment.

As is apparent from the comparison of measurement points P1 and P3 indicated in the drawing, the following effect can be produced by taking the following measure: a laminated structure of a CAP layer CP1 comprised of Ru and a hard mask HM1 comprised of Ta is formed over an MTJ device MD1; and resist etching is carried out using ammonia gas without use of oxygen gas. As a result, variation in write current Isw can be reduced by 20% or so as compared with measurement point P1. Also under an ashing condition involving use of hydrogen gas or synthesis gas of hydrogen and nitrogen in place of ammonia gas, the same effect can be expected. That is, in ashing without use of oxygen gas (ashing without $O_2$), the above effect can be expected because oxidation is not accelerated or for other like reasons.

Figure 23:
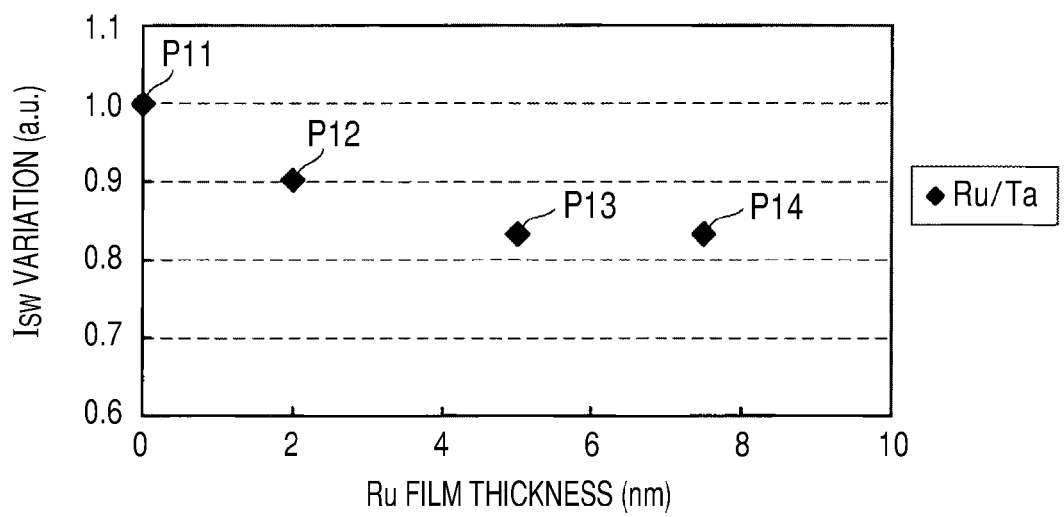
FIG. 23 is a graph indicating the film thickness dependence of a CAP layer in the first embodiment.

FIG. 23 is a graph indicating the film thickness dependence of a CAP layer CP1. The horizontal axis indicates the film thickness of the CAP layer CP1 and the vertical axis indicates variation in write current Isw (a.u.). The graph shown in FIG. 23 indicates a case where the following laminated structure is used for the layer over the MTJ device MD1 and ashing without $O_2$ is used for resist removal processing when the hard masks HM1 are formed: a laminated structure of a CAP layer CP1 using a simple substance of crystalline Ru as a constituent material and a hard mask using a simple substance of crystalline Ta as a constituent material.

As is apparent from measurement points P11 to P14 indicated in the drawing, variation in write current Isw can be reduced by 20% or so by setting the film thickness of the CAP layer CP1 comprised of Ru to 5 nm or above. A possible reason why variation in write current Isw is suppressed is as follows: a film thickness of not less than 5 nm is probably required for the CAP layer CP1 (first upper metal layer 32) to sufficiently absorb damage done when the hard masks HM1 are formed.

Figure 24:
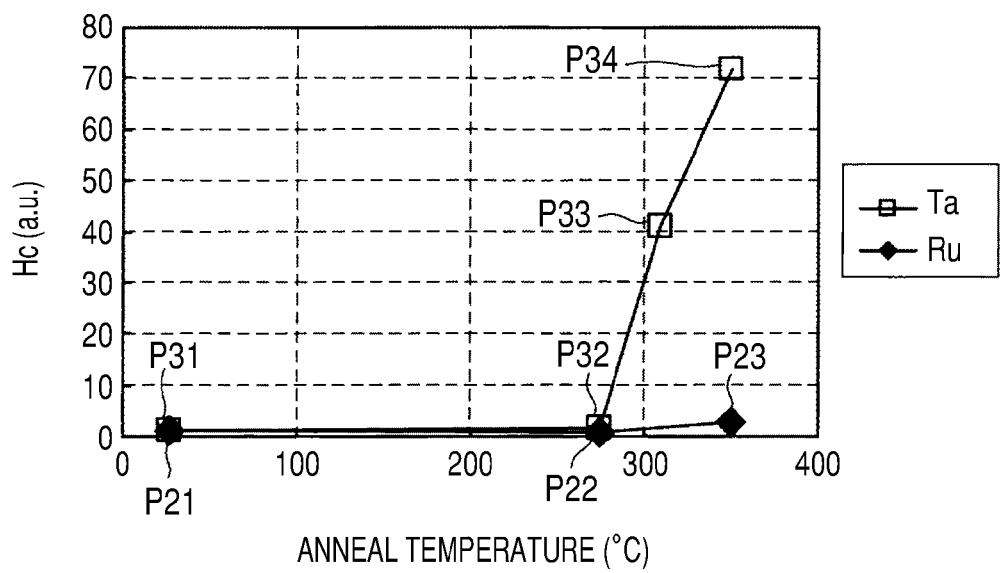
FIG. 24 is a graph indicating the material dependence of a CAP layer observed when the upper magnetic film of MTJ devices is comprised of CoFeB.

FIG. 24 is a graph indicating the material dependence of a CAP layer CP1 observed when the upper magnetic film of each MTJ device MD1 is comprised of CoFeB. The horizontal axis indicates magnetic field anneal temperature and the vertical axis indicates the coercive force Hc (a.u.) of the MTJ device MD1. Magnetic field anneal refers to annealing carried out while a magnetic field is applied. In the above description of the first and second manufacturing methods, magnetic field anneal is not explicitly referred to. In the MRAM manufacturing process, however, magnetic field anneal is carried out by a predetermined number of times after the film 31 for MTJ is formed. The other processes as well as magnetic field anneal are carried out at a temperature equal to or lower than the magnetic field anneal temperature.

In the drawing, measurement points P21 to P23 indicate cases where a single layer of crystalline Ru is formed as the CAP layers CP1 (similar to this embodiment); and measurement points P31 to P34 indicate cases where a single layer of Ta is used for the layer over the MTJ device MD1.

As indicated by measurement points P21 to P23 in the drawing, the following takes place when a CAP layer CP1 comprised of Ru is used for the layer over each MTJ device MD1: even when the anneal temperature exceeds 300° C., the coercive force Hc of CoFeB hardly fluctuates. When a single layer of Ta is used over each MTJ device, meanwhile, the following takes place: when the anneal temperature exceeds 300° C., the coercive force Hc of CoFeB greatly fluctuates. Therefore, it is very difficult to accurately set a coercive force Hc.

As mentioned above, the effect of suppressing the crystallization of CoFeB can be effectively produced by using Ru, not Ta, for the CAP layer CP1 formed directly on each MTJ device MD1. Therefore, the coercive force Hc of each MTJ device MD1 is not impaired even when an anneal temperature of 350° C. or so is used.

Further, Ru that is a constituent material of the CAP layer CP1 has such a property that it can suppress the diffusion of B from CoFeB as a constituent material of the upper magnetic film 8 as the free layer of each MTJ device MD1. Therefore, it is possible to reduce a dead layer (area where magnetism has been lost) in the free layer of each MTJ device MD1. This is because when B is lost from a constituent material of a magnetic film, crystallization of the magnetic film is accelerated. Therefore, it is desirable that a CAP layer CP1 should be formed over each MTJ device MD1 so that Ru is brought into direct contact with the magnetic film. To maintain the non-crystallininty of a magnetic film, it is desirable that noncrystalline aluminum oxide should also be used for a tunnel insulating film.

In the MRAM in the first embodiment, as mentioned above, a constituent material of the CAP layer CP1 formed over each MTJ device MD1 is of simple substance of crystalline Ru and a constituent material of the hard mask HM1 is of simple substance of Ta. When Ru is noncrystalline, it is supposed that the effect of suppressing the diffusion of B from a magnetic film will be reduced. For this reason, a constituent material of the CAP layer CP1 uses a simple substance of crystalline Ru.

As a result, the following effect can be obtained by suppressing variation in write current Isw and accurately setting a coercive force Hc: a semiconductor device having MTJ devices excellent in operating characteristics can be obtained.

(Respective Film Thicknesses of CAP Layer CP1 and Hard Mask HM1)

In the CAP layer CP1 containing a simple substance of crystalline Ru as a constituent material, it is supposed that a film thickness of 5 to 10 nm is desirable. Setting the film thickness of the CAP layer CP1 to 5 nm or above is intended to effectively reduce variation in write current Isw as indicated in FIG. 23.

Meanwhile, the reason why the film thickness of the CAP layer CP1 is set to 10 nm or below is as follows: the CAP layers CP1 and the MTJ devices MD1 are formed by patterning the first upper metal layer 32 and the film 31 for MTJ using the hard masks HM1 as a mask; therefore, it is required to set a film thickness so that variation in the shape of individual MTJ devices MD1 is suppressed during patterning.

Further, it is supposed that a film thickness of 40 to 80 nm is desirable for the hard mask HM1 containing a simple substance of crystalline Ta as a constituent material. The reason why the film thickness of the hard mask HM1 is set to 40 nm or above is as follows: it is required to ensure sufficient tolerability for hard masks.

Meanwhile, the reason why the film thickness of the hard mask HM1 is set to 80 nm or below is as follows: it is required to set the film thickness so that variation in the shape of individual hard masks HM1 can be suppressed when the hard masks HM1 are patterned using the resist patterns 34 as a mask.

It is apparent from the above consideration that it is desirable to take the following measure when the operating characteristics of each MTJ device are enhanced with variation in the shape of individual MTJ devices MD1 taken into account: the hard mask HM1 and the CAP layer CP1 are so formed that the film thickness of the hard mask is larger than the film thickness of the CAP layer.

Second Embodiment

Figure 25:
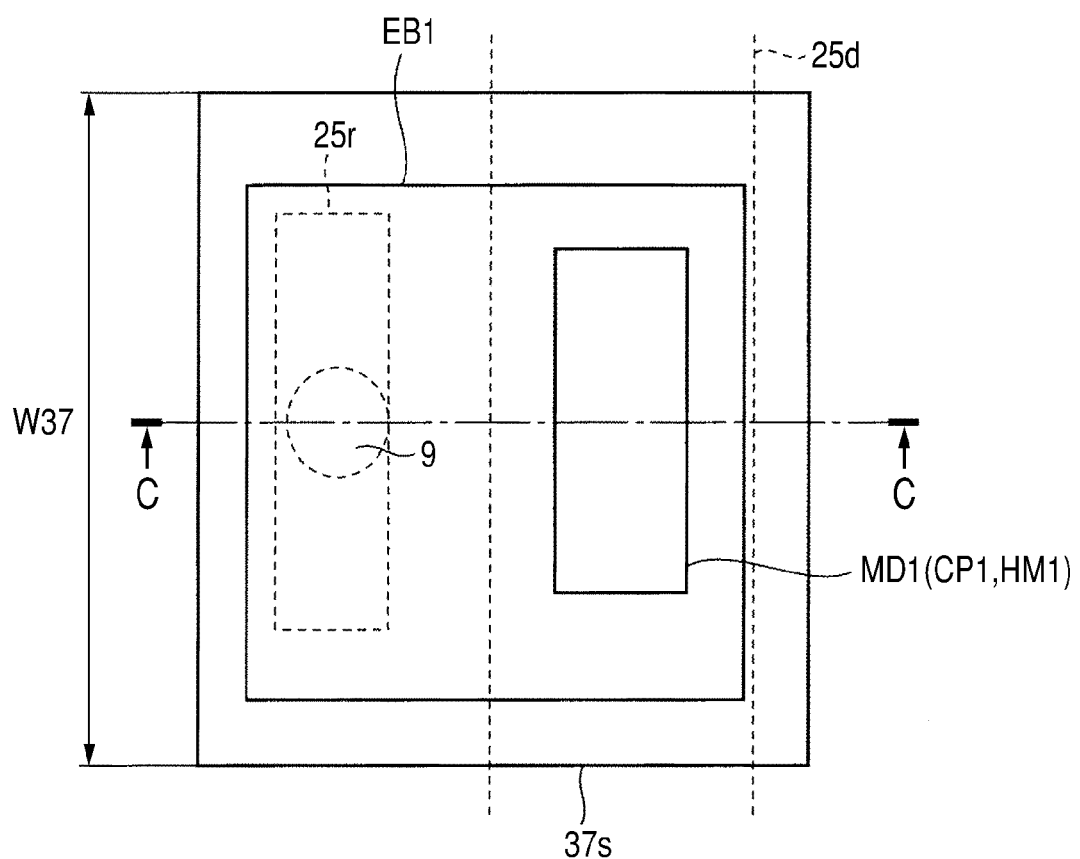
FIG. 25 is a plan view corresponding to the memory device configuration of MRAM in a second embodiment.

FIG. 25 is a plan view corresponding to the memory device configuration of MRAM in the second embodiment. As illustrated in the drawing, the metal film strap EB1 is electrically coupled with a read line 25r positioned beneath through a via hole 9. Meanwhile, each MTJ device MD1 (including the CAP layer CP1 and the hard mask HM1) is formed above a digit line 25d and is directly coupled with an upper Cu wiring 37 (formation width: W37).

(Manufacturing Method)

Figure 28A:
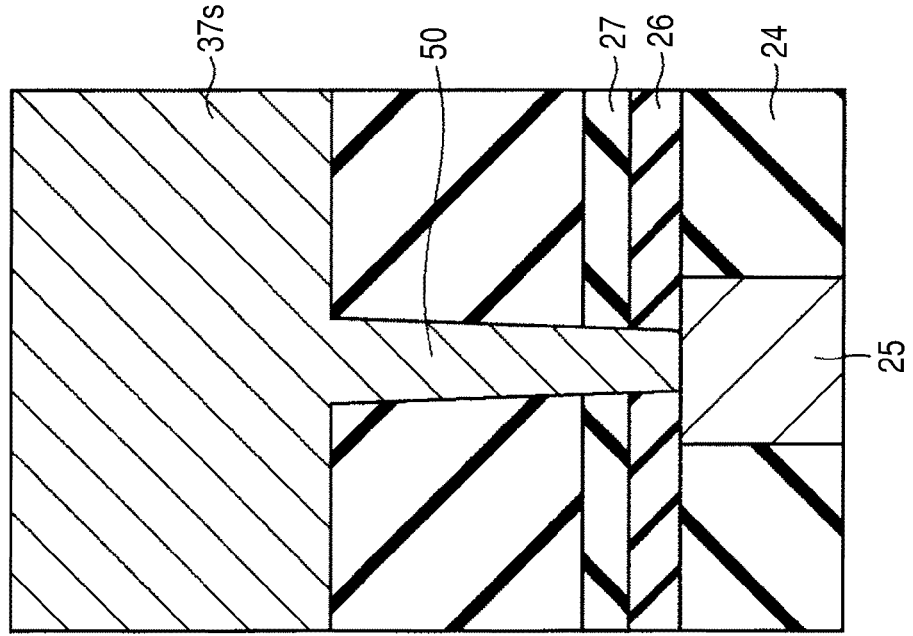
FIG. 28A is a sectional view illustrating the manufacturing method for MARAM in the second embodiment.
Figure 28B:
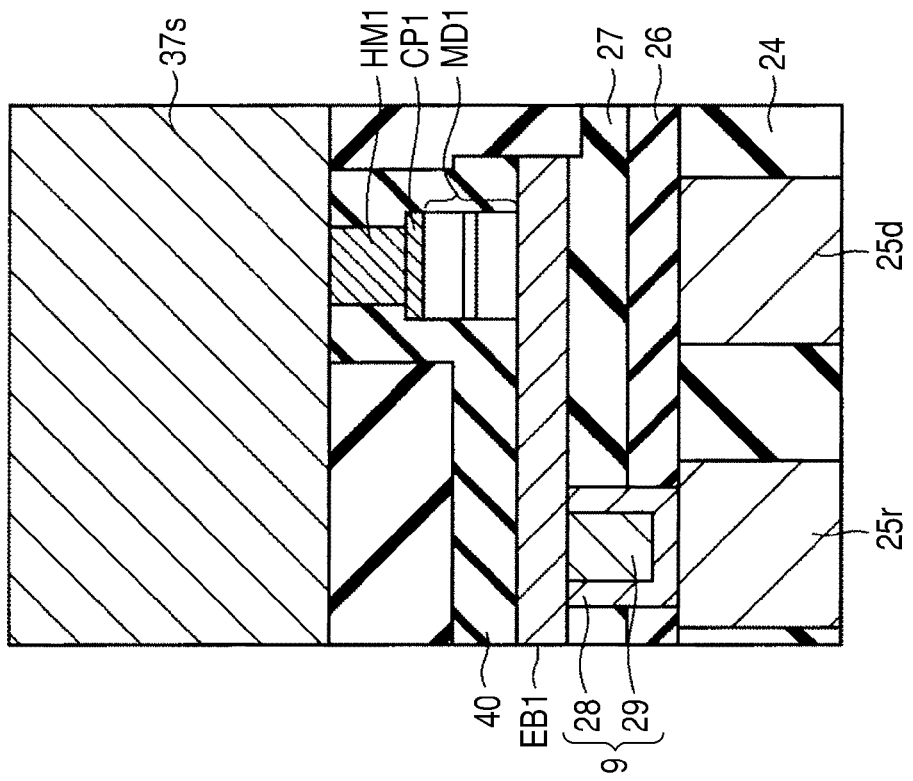
FIG. 28B is a sectional view illustrating the manufacturing method for MARAM in the second embodiment.
Figure 29:
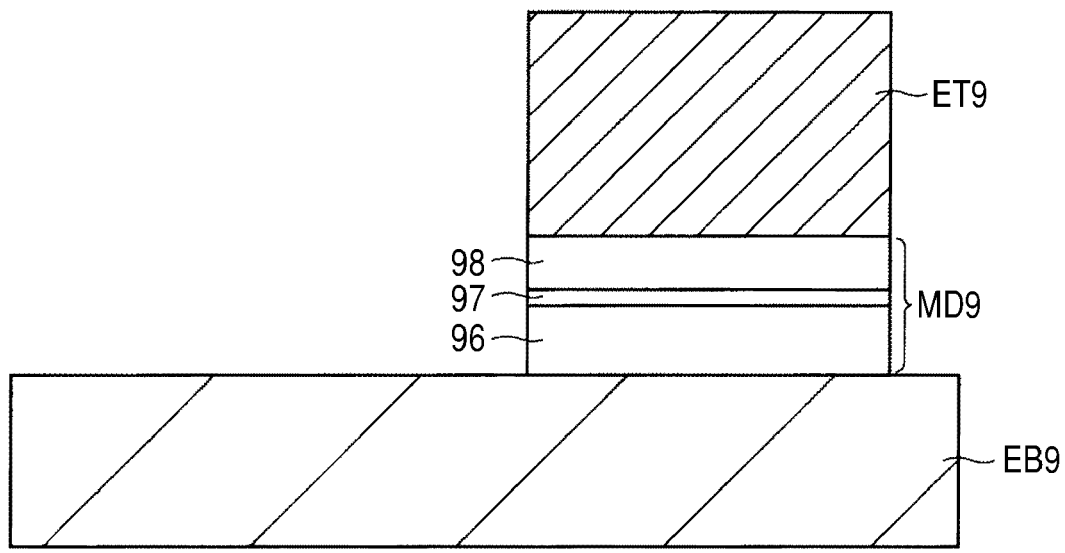
FIG. 29 is a sectional view illustrating the general structure of a memory device of a conventional MRAM.

The drawings from FIG. 26A to FIG. 28B are sectional views illustrating a manufacturing method for the MARAM in the second embodiment. FIGS. 26A, 27A, and 28A illustrate the structure of a memory cell portion and FIGS. 26B, 27B, and 28B illustrate the structure of a peripheral circuit portion. FIGS. 26A, 27A, and 28A are equivalent to the section taken along line C-C of FIG. 25. Description will be given to the manufacturing method with reference to these drawings.

First, the same processes as in the first manufacturing method in the first embodiment illustrated in FIG. 4 to FIG. 11 are followed. As illustrated in FIGS. 26A and 26B, however, it is desirable that the film thickness of the hard mask HM1 should be larger than in the structure in the first embodiment.

As illustrated in FIGS. 26A and 26B, an interlayer insulating film 35 comprised of $SiO_2$ is formed over the entire surface. In the peripheral circuit portion, nothing is formed over the interlayer insulating film 27 and thus the interlayer insulating film 35 is formed over the entire surface of the interlayer insulating film 27.

As illustrated in FIGS. 26A and 26B, thereafter, via holes 50 penetrating the interlayer insulating film 35 are formed in the peripheral circuit portion by etching using photolithography.

As illustrated in FIGS. 27A and 27B, subsequently, the interlayer insulating film 35 is etched using photolithography to selectively remove part of the interlayer insulating film 35 and the over-MTJ insulating film 40. The surfaces of the hard masks HM1 are thereby exposed to form wiring grooves that make the buried regions of upper Cu wirings in the interlayer insulating film 35.

As illustrated in FIGS. 28A and 28B, subsequently, a barrier metal layer (not shown) is deposited over the entire surface including the interior of the via holes 50. Further, Cu is deposited by plating and then CMP processing is carried out. In each memory cell portion, as a result, an upper Cu wiring 37s directly coupled with a hard mask HM1 is obtained. That is, each upper Cu wiring 37s (including the barrier metal layer) itself also serves as an electrical coupling portion formed over the surface of a hard mask HM1 and functions as an upper wiring portion electrically coupled with an MTJ device MD1.

In the memory cell portion, as a result, direct electrical coupling with the hard mask HM1 of the MTJ device MD1 can be obtained by the upper Cu wiring 37s without separately providing a via hole.

In the peripheral circuit portion, meanwhile, the upper Cu wiring 37s buried in the via holes 50 and formed in the interlayer insulating film 35 is obtained.

Finally, an interlayer insulating film (not shown) is formed over the entire surface. This completes the MRAM in the second embodiment in which the hard mask HM1, CAP layer CP1, MTJ device MD1, and metal film strap EB1 are used as a memory cell.

Modifications (Type of MTJ Device MD1)

Usually, the following MTJ device can be applied as the MTJ device MD1: an MTJ device (MTJ device of the first kind) having such a characteristic that its resistance value is varied by an externally applied magnetic field. Meanwhile, MTJ devices (MTJ device of the second kind) designated as STT (Spin Torque Transfer)-RAM have such a property that their resistance value is varied by a current passed through themselves. This MTJ device designated as STT-RAM may be used as the MTJ device MD1.

The effect described in relation to the first embodiment and the second embodiment is similarly obtained when the MTJ device of the first kind is used as the MTJ device MD1 and when the MTJ device of the second kind is used.

What is claimed is:

1. A manufacturing method for semiconductor devices comprising the steps of:
   (a) forming a lower conductive layer for lower electrode above a semiconductor substrate;
   (b) forming a laminated structure for MTJ device obtained by laminating a first magnetic film, an insulating film, and a second magnetic film in this order over the lower conductive layer, the second magnetic film containing boron and the insulating film containing a noncrystalline material;
   (c) forming a first conductive layer for first protective film over the laminated structure, the first conductive layer containing a simple substance structure of crystalline ruthenium;
   (d) forming a second conductive layer for second protective film over the first conductive layer, the second conductive layer containing a simple substance structure of tantalum;
   (e) patterning the second conductive layer to form the second protective film; and
   (f) patterning the first conductive layer and the laminated structure using the second protective film as a mask to form the first protective film and the MTJ device.

2. The manufacturing method for semiconductor devices according to claim 1,
   wherein the step of (e) includes the steps of:
   (e-1) selectively forming a resist pattern over the second conductive layer;
   (e-2) patterning the second conductive layer using the resist pattern as a mask; and
   (e-3) after the execution of the step of (e-2), removing the resist pattern by aching under a condition not involving oxygen gas.

3. The manufacturing method for semiconductor devices according to claim 1, comprising the steps of:
   (g) forming an insulating film so that at least the MTJ device and first and second protective films are covered therewith;
   (h) selectively removing the insulating film to expose at least part of the surface of the second protective film; and
   (i) forming an upper wiring portion over the second protective film, the upper wiring portion including an electrical coupling portion formed over the surface of the second protective film.

4. The manufacturing method for semiconductor devices according to claim 1,
   wherein the thickness of the second protective film is larger than that of the first protective film.

5. The manufacturing method for semiconductor devices according to claim 1,
   wherein the step of (c) includes the step of:
   forming the first conductive layer on the second magnetic film in contact with the second magnetic film.

* * * * *